(12) United States Patent
Berkhout

(10) Patent No.: US 10,367,460 B2
(45) Date of Patent: Jul. 30, 2019

(54) AMPLIFIER CIRCUIT

(71) Applicant: NXP B.V., Eindhoven (NL)

(72) Inventor: Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/001,127

(22) Filed: Jun. 6, 2018

(65) Prior Publication Data

US 2019/0007011 A1    Jan. 3, 2019

(30) Foreign Application Priority Data

Jun. 30, 2017  (EP) .................................... 17179141

(51) Int. Cl.
*H03F 3/38*    (2006.01)
*H03F 3/217*    (2006.01)
(Continued)

(52) U.S. Cl.
CPC ......... *H03F 3/2175* (2013.01); *H03F 3/2171* (2013.01); *H03F 3/2173* (2013.01);
(Continued)

(58) Field of Classification Search
CPC ................................... H03F 3/38; H03F 3/217
(Continued)

(56) References Cited

U.S. PATENT DOCUMENTS 7,557,744 B2    7/2009  Ido et al.
7,932,778 B1 *  4/2011  Cyrusian ................. H03F 3/217
                                                    330/10

(Continued)

FOREIGN PATENT DOCUMENTS

WO    WO 03/067753 A1    8/2003

OTHER PUBLICATIONS

Berkhout, Marco et al; "A 4Ω 2.65W Class-D Audio Amplifier With Embedded DC-DC Boost Converter, Current Sensing ADC and DSP for Adaptive Speaker Protection"; IEEE Journal of Solid-State Circuits, vol. 48, No. 12; pp. 2952-2961 (Dec. 2013).

(Continued)

*Primary Examiner* — Henry Choe

(57) ABSTRACT

An amplifier circuit comprising: a delta-PWM-modulator, a three-level-DAC, a loop-integrator, and a comparator. The delta-PWM-modulator receives a digital-input-signal; and processes the digital-input-signal and a modulator-triangular-signal to generate a delta-pulse-width-modulation-signal. The delta-pulse-width-modulation-signal is representative of the difference between a square-wave-carrier-signal and a digital-pulse-width-modulation of the digital-input-signal. The three-level-DAC receives the delta-pulse-width-modulation-signal from the delta-PWM-modulator and provides a three-level-analog-signal. The loop-integrator comprises: a virtual-ground-node-terminal configured to receive: (i) the three-level-analog-signal from the three-level DAC; and (ii) a feedback-signal from an output stage of the amplifier circuit via a feedback loop; and an integrator-output-terminal configured to provide a loop-integrator-output-signal. The comparator comprises a comparator-input-terminal configured to receive the loop-integrator-output-signal; a comparator-reference-terminal configured to receive a triangular-reference-signal that corresponds to the integral of the square-wave-carrier-signal; and a comparator-output-terminal configured to provide a drive-signal suitable for driving an output-stage of the amplifier circuit.

15 Claims, 16 Drawing Sheets

(51) Int. Cl.
*H03K 7/08* (2006.01)
*H03M 3/00* (2006.01)

(52) U.S. Cl.
CPC .............. *H03K 7/08* (2013.01); *H03M 3/432* (2013.01); *H03M 3/456* (2013.01); *H03M 3/50* (2013.01); *H03F 2200/331* (2013.01)

(58) Field of Classification Search
USPC .................................................. 330/10, 251
See application file for complete search history.

(56) References Cited

U.S. PATENT DOCUMENTS

| 7,961,120 | B1* | 6/2011 | Cyrusian ................. | H03M 5/08 |
| | | | | 330/10 |
| 8,816,763 | B2* | 8/2014 | Cyrusian ................. | H03F 3/217 |
| | | | | 330/10 |
| 8,890,608 | B2 | 11/2014 | Sahandiesfanjani et al. | |
| 2018/0337637 | A1* | 11/2018 | Galal ..................... | H03F 1/0216 |
| 2019/0007008 | A1* | 1/2019 | Berkhout ................ | H03K 7/08 |

OTHER PUBLICATIONS

Berkhout, M et al; "Class-D Audio Amplifiers in Mobile Applications"; IEEE Transactions on Circuits and Systems-I: Reg. Papers, vol. 56, No. 5; pp. 992-1002 (May 2010).

Dooper, Lutzen et al; "A 3.4 W Digital-In Class-D Audio Amplifier in 0.14m CMOS"; IEEE Journal of Solid-State Circuites, vol. 47, No. 7; pp. 1524-1534 (Jul. 2012).

* cited by examiner

AMPLIFIER CIRCUIT

CROSS-REFERENCE TO RELATED APPLICATIONS

This application claims the priority under 35 U.S.C. § 119 of European patent application no. 17179141.1, filed Jun. 30, 2017 the contents of which are incorporated by reference herein.

The present disclosure relates to amplifier circuits, and in particular, although not exclusively, to amplifier circuits that process digital pulse width modulated (DPWM) signals.

According to a first aspect of the present disclosure there is provided an amplifier circuit comprising:
a delta-PWM-modulator configured to:
  receive a digital-input-signal;
  process the digital-input-signal and a modulator-triangular-signal to generate a delta-pulse-width-modulation-signal, wherein the delta-pulse-width-modulation-signal is representative of the difference between a square-wave-carrier-signal and a digital-pulse-width-modulation of the digital-input-signal;
a three-level-DAC configured to receive the delta-pulse-width-modulation-signal from the delta-PWM-modulator and provide a three-level-analogue-signal;
a loop-integrator comprising:
  a virtual-ground-node-terminal configured to receive:
    (i) the three-level-analogue-signal from the three-level DAC; and (ii) a feedback-signal from an output stage of the amplifier circuit via a feedback loop;
  an integrator-output-terminal configured to provide a loop-integrator-output-signal, which is proportional to an integral of the signals received at the virtual-ground-node-terminal; and
a comparator comprising:
  a comparator-input-terminal configured to receive the loop-integrator-output-signal;
  a comparator-reference-terminal configured to receive a triangular-reference-signal that corresponds to the integral of the square-wave-carrier-signal; and
  a comparator-output-terminal configured to provide a drive-signal suitable for driving an output-stage of the amplifier circuit.

Such an amplifier circuit can provide improved noise performance because only the delta-pulse-width-modulation-signal is processed by the three-level-DAC.

In one or more embodiments, the modulator-triangular-signal comprises a first-modulator-triangular-waveform and a second-modulator-triangular-waveform.

In one or more embodiments, troughs of the first-modulator-triangular-waveform correspond in time to one of rising and falling edges of the square-wave-carrier-signal; and/or peaks of the second-modulator-triangular-waveform correspond in time to the other or rising and falling edges of the square-wave-carrier-signal.

In one or more embodiments, the second-modulator-triangular-waveform corresponds to a reflected, time-shifted, version of the first-modulator-triangular-waveform. The reflection may be about a zero-signal-level.

In one or more embodiments, the second-modulator-triangular-waveform is time shifted by half a period with reference to the first-modulator-triangular-waveform.

In one or more embodiments, the delta-PWM-modulator is configured to provide the delta-pulse-width-modulation-signal such that it has pulses located on an edge of the square-wave-carrier-signal.

In one or more embodiments, the first-modulator-triangular-waveform and the second-modulator-triangular-waveform each have range of values that overlaps with a range of potential values of the digital-input-signal, for the entire period of the square-wave-carrier-signal.

In one or more embodiments, the amplifier circuit further comprises: a sigma-delta-modulator configured to provide the digital-input-signal to the delta-PWM-modulator. The sigma-delta-modulator and/or the delta-PWM-modulator may be configured to provide the digital-input-signal such that a new value of the digital-input-signal commences at a time corresponding to each top and/or bottom of each of the first-modulator-triangular-waveform and the second-modulator-triangular-waveform.

In one or more embodiments, the delta-PWM-modulator is configured to provide the delta-pulse-width-modulation-signal such that it has a constant transition rate.

In one or more embodiments, the delta-PWM-modulator is configured to provide the delta-pulse-width-modulation-signal such that it includes a pulse at each potential transition in the value of the digital-input-signal, irrespective of the value of the sampled-digital-input-signal.

In one or more embodiments, one or both of the first-modulator-triangular-waveform and the second-modulator-triangular-waveform have a range of values that are: greater than or equal to a negative-full-scale-value, and less than or equal to a positive-full-scale-value.

In one or more embodiments:
  the first-modulator-triangular-waveform includes negative protrusions extending from each trough of the first-modulator-triangular-waveform to a signal level that is less than or equal to the negative-full-scale-value; and/or
  the second-modulator-triangular-waveform includes positive protrusions extending from each peak of the second-modulator-triangular-waveform to a signal level that is greater than or equal to the positive-full-scale-value.

In one or more embodiments, the first-modulator-triangular-waveform and the second-modulator-triangular-waveform each have a range of values that overlaps with a range of potential values of the digital-input-signal, for only a subset of the period of the square-wave-carrier-signal.

In one or more embodiments, the signal-level ranges of the first-modulator-triangular-waveform and the second-modulator-triangular-waveform do not overlap.

In one or more embodiments, the modulator-triangular signal has a range of values that are: greater than or equal to a negative-full-scale-value, and less than or equal to a positive-full-scale-value.

The amplifier circuit may be an audio amplifier circuit.

There may be provided a smart speaker driver comprising any circuit disclosed herein.

There may be provided an integrated circuit comprising any circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

The acquisition and reproduction of audio signals was one of the first applications of electronic circuits. Today, audio electronics are ubiquitous and can be found in television and hi-fi stereo sets, car audio systems and more recently in mobile or cellular phones along with many other portable applications. A majority of these electronics is in the form of integrated circuits.

Figure 1:
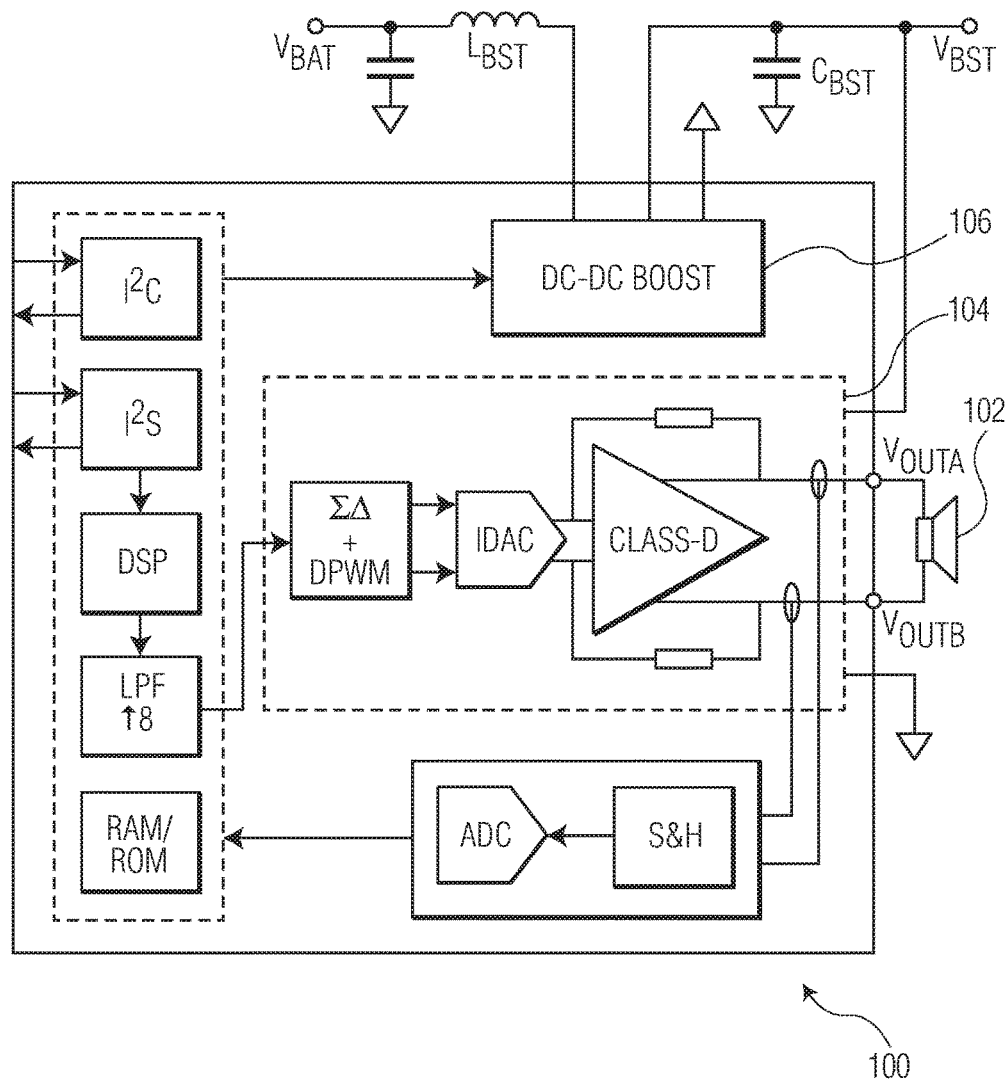
FIG. 1 illustrates a block diagram of a smart speaker driver for use in mobile phones.

FIG. 1 illustrates a block diagram of a smart speaker driver 100 for use in mobile phones. A smart speaker driver 100 can maximize acoustic output while ensuring that a loud-speaker 102 is not damaged. This may be achieved by predicting a membrane excursion and estimating a voice-coil temperature by means of a speaker model. The membrane excursion is directly related to the sound pressure level (SPL). Differences between the speaker model and the real performance can be reduced by feedback of a real-time measurement of current entering the loud-speaker 102.

A component of the smart speaker driver 100 is a high efficiency class-D amplifier 104 that drives the loud-speaker 102. The class-D amplifier 104 is supplied by a DC-DC boost converter 106 in this example, which can provide high output power even at a low battery voltage. The DC-DC boost converter 106 is controlled from the digital domain and may only be enabled when high power is required at the output of the class-D amplifier 104.

The combined efficiency of the DC-DC boost converter 106 and the class-D amplifier 104 can be optimized by performing a coarse envelope tracking of the audio signal.

Figure 2:
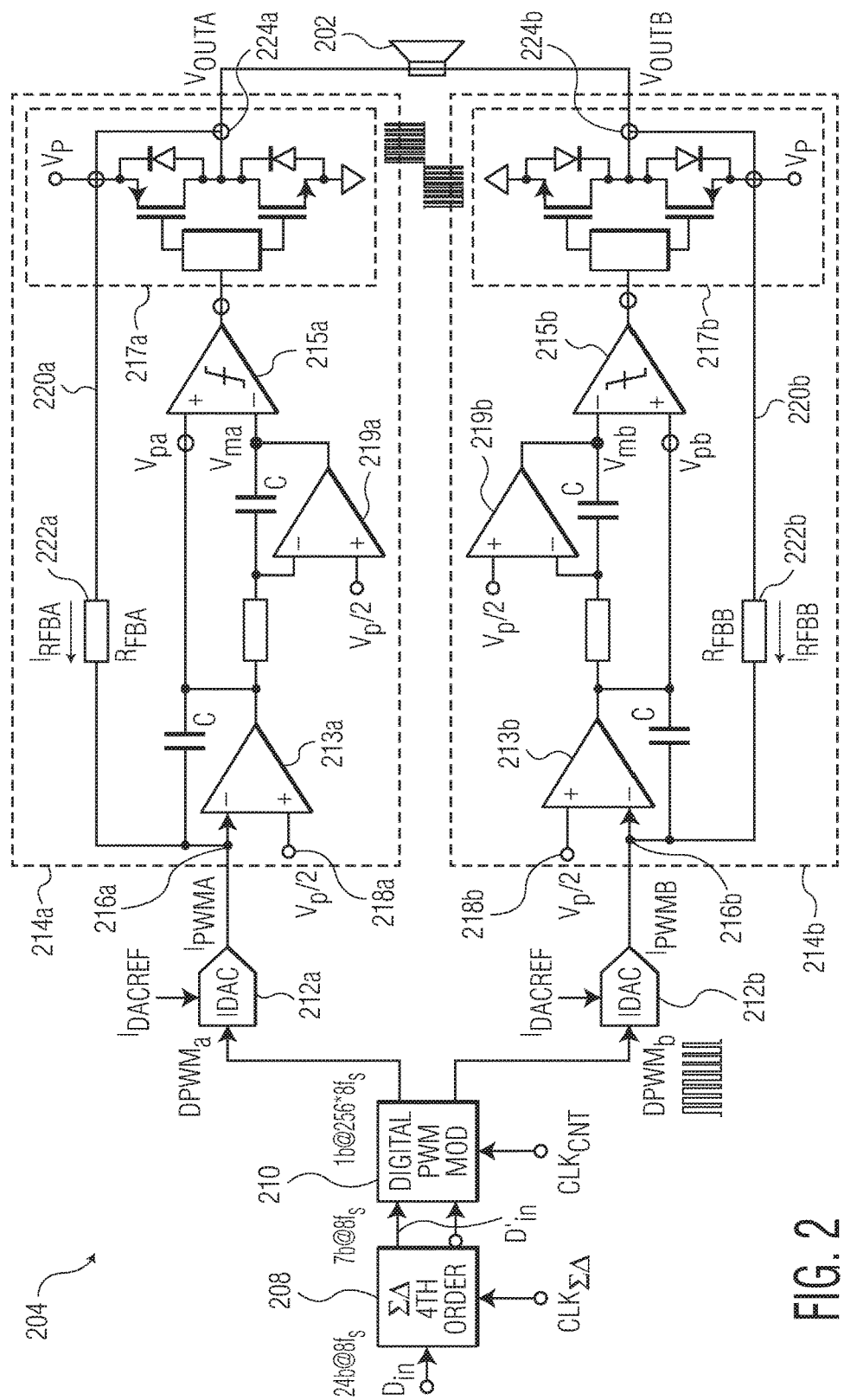
FIG. 2 shows an example detailed audio path of a class-D amplifier.

FIG. 2 shows an example detailed audio path of a class-D amplifier 204 (hereinafter referred to as the amplifier 204). The amplifier 204 has a direct-pulse-width-modulation (direct-PWM) architecture. The amplifier 204 is configured to receive a digital-input-signal $D_{in}$, and provide an output signal across two output-stage-output-terminals 224a, 224b that can drive the loud-speaker 202.

The amplifier 204 in this example comprises a fourth-order delta-sigma-modulator 208 coupled to a digital-pulse-width-modulation-modulator 210 (digital-PWM-modulator). The digital-PWM-modulator 210 is coupled in turn to two digital-to-analogue-converters 212a, 212b (DACs). Each DAC 212a, 212b is coupled to an analogue-feedback-circuit 214a, 214b. The two analogue-feedback-circuits 214a, 214b are coupled to the loud-speaker 202.

The amplifier 204 depicted in FIG. 2 is in a bridge-tied-load (BTL) configuration. In the BTL configuration, there are effectively two amplifying stages defined by each DAC 212a, 212b and associated analogue-feedback-circuit 214a, 214b. This BTL configuration doubles the available voltage swing for the output signal, for a given supply voltage $V_p$. Furthermore, the BTL configuration allows for filter-less connection of the loud-speaker 202. This filter-less BTL configuration may be well-suited in mobile applications.

The fourth-order sigma-delta-modulator 208 receives the digital-input-signal $D_{in}$. In this example, $D_{in}$ is a 24-bit pulse-code-modulation (PCM) signal oversampled 8× at 8×48 kHz=384 kHz. This 8× oversampling ratio can match a desired pulse-width-modulation (PWM) carrier frequency. The fourth-order sigma-delta-modulator 208 reduces $D_{in}$ to an 8-bit PCM sampled-digital-input-signal $D'_{in}$. The digital-PWM-modulator 210 is configured to receive the sampled-digital-input-signal $D'_{in}$ from the sigma-delta-modulator 208. The digital-PWM-modulator 210 produces two digital-PWM-signals $DPWM_a$, $DPWM_b$.

Figure 3:
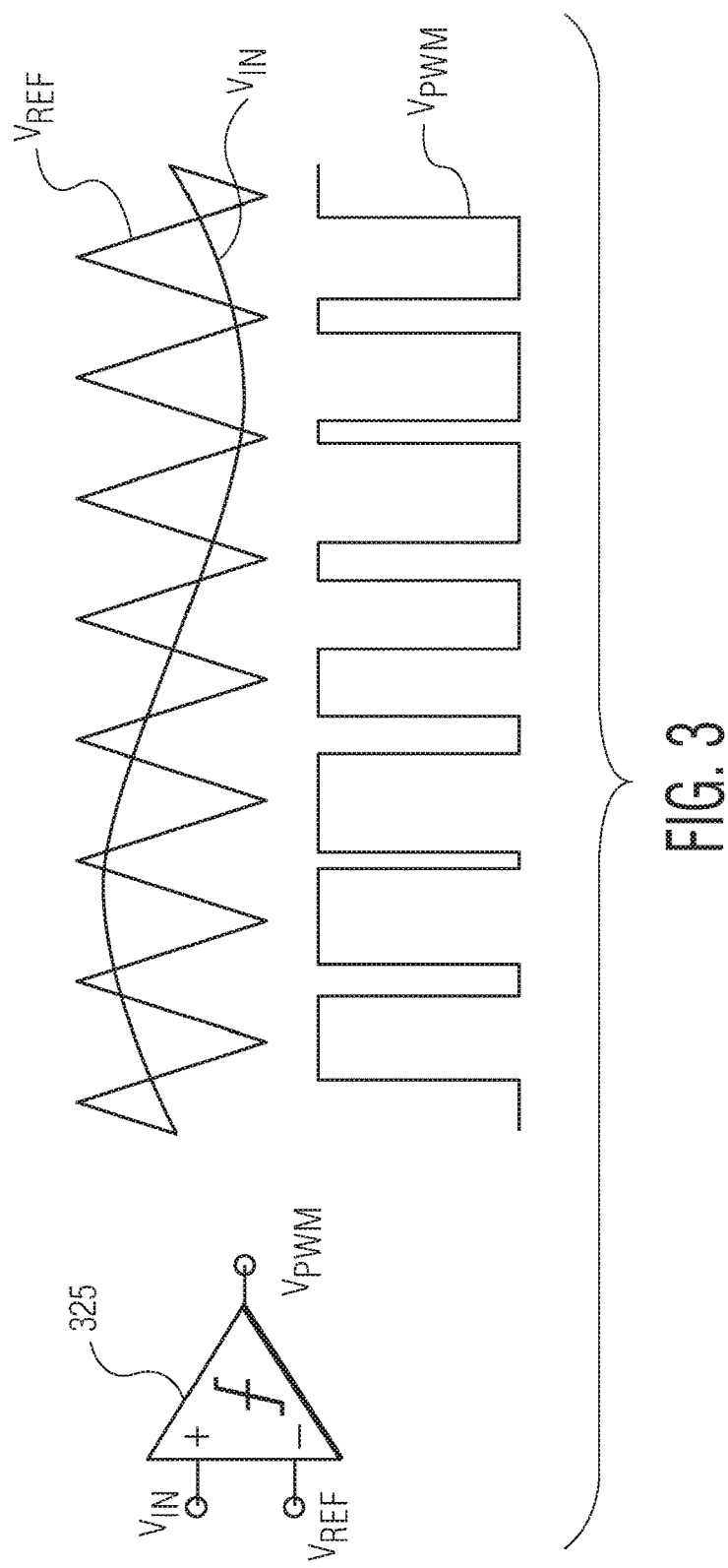
FIG. 3 shows graphically an example of how a comparator can be used to generate a PWM-signal from an analogue-input-signal.

FIG. 3 shows graphically an example of how a comparator 325 can be used to generate a PWM-signal $V_{PWM}$ from an analogue-input-signal $V_{IN}$. The comparator 325 compares the (low-frequency) analogue-input-signal $V_{IN}$ with a (high-frequency) triangular-reference-waveform $V_{REF}$. As shown on the right-hand side of FIG. 3, the output signal of the comparator 325 is a PWM-signal $V_{PWM}$ that has a duty-cycle that is proportional to the value of the analogue-input-signal $V_{IN}$.

Figure 4:
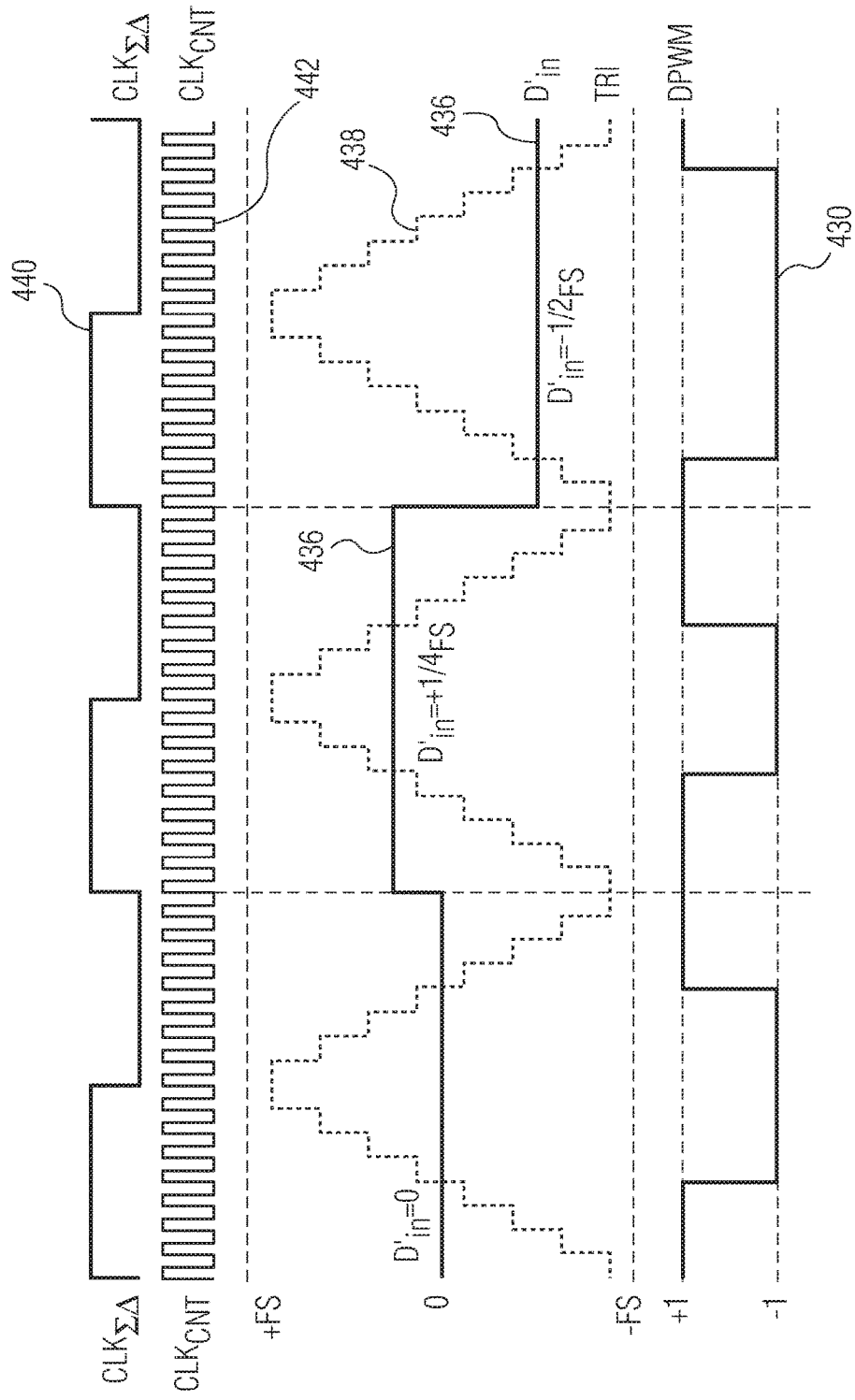
FIG. 4 illustrates the generation of a digital-PWM-signal in a similar manner to that illustrated in FIG. 3.

FIG. 4 illustrates the generation of a digital-PWM-signal DPWM 430 in a similar manner to that illustrated in FIG. 3. The digital-PWM-modulator of FIG. 2 may generate digital-PWM-signals $DPWM_a$, $DPWM_b$ in this way. In the example of FIG. 4, the digital-PWM-signal DPWM 430 is provided by comparing a digital-input-signal $D_{in}$ to a modulator-triangular-signal TRI 438. In this example, the digital-input-signal $D_{in}$ is a sampled-digital-input-signal $D'_{in}$ 436 which can be provided by a sigma-delta-modulator as in FIG. 2. The sampled-digital-input signal $D'_{in}$ 436 is a 3-bit PCM signal with an input-sample-rate equal to the frequency of a sigma-delta-clock-signal $CLK_{\Sigma\Delta}$ 440 provided by the sigma-delta-modulator. In this example the modulator-triangular-signal TRI 438 is a staircase-reference-signal that extends between peaks (at or near positive-full-scale (+FS) in this example) and troughs (at or near negative-full-scale (−FS) in this example). The modulator-triangular-signal TRI 438 has a triangular-sample-rate equal to the frequency of a modulator-triangular-clock-signal $CLK_{CNT}$ 442. The triangular-sample-rate is higher than the input-sample-rate and determines the timing resolution of the digital-PWM-signal DPWM 430. In this example, the frequency of the modulator-triangular-clock-signal $CLK_{CNT}$ 442 is 16 times higher than the frequency of the sigma-delta-clock-signal $CLK_{\Sigma\Delta}$ 440.

The period of the modulator-triangular-signal TRI 438 determines a carrier frequency of the digital-PWM-signal DPWM 430.

The example shown in FIG. 4 illustrates signals with low resolution for clarity. In a practical implementation, the sampled-digital-input signal $D'_{in}$ 436 may be a 7-bit PCM signal and the modulator-triangular-signal TRI 438 may have a triangular-sample-rate equal to 256 times the sigma-delta-sample-rate.

Sampling of the sampled-digital-input-signal $D'_{in}$ may cause distortion after generation of the digital-PWM-signal DPWM 430. This distortion can be mainly second harmonic. For an amplifier used in the balanced BTL configuration of FIG. 2, the even-order harmonics may cancel. The remaining third harmonic can be small enough to be considered negligible.

Returning to FIG. 2, two digital-to-analogue converters (DAC) 212a, 212b receive the digital-PWM-signals $DPWM_a$, $DPWM_b$ from the digital-PWM-modulator 210 and transform the digital-PWM-signals $DPWM_a$, $DPWM_b$ into two analogue-signals. In this example, the digital-PWM-signals $DPWM_a$, $DPWM_b$ are 1-bit signals and the two DACs 212a, 212b are 1-bit current-DACs that produce two analogue-signals as two bi-directional IDAC-currents $I_{PWMA}$, $I_{PWMB}$. The two IDAC-currents $I_{PWMA}$, $I_{PWMB}$ have the same profile as the digital-PWM-signals $DPWM_a$, $DPWM_b$ and switch between $\pm I_{DACREF}$, where $I_{DACREF}$ is an IDAC-reference-current.

Each analogue-feedback-circuit 214a, 214b comprises a first-loop-integrator 213a, 213b; a comparator 215a, 215b; a feedback-loop 220a, 220b and an output stage 217a, 217b. The analogue-feedback-circuits 214a, 214b shown in FIG. 2 are second-order feedback circuits and therefore also comprise a second-loop-integrator 219a, 219b. A virtual-ground-node-terminal 216a, 216b of each first-loop-integrator 213a, 213b is configured to receive (i) the respective analogue-signal from the corresponding DAC 212a, 212b; and (ii) a feedback-signal from the corresponding feedback-loop 220a, 220b, as will be discussed below. Reference-terminals 218a, 218b of the two first-loop-integrators 213a, 213b are configured to receive a reference-signal. In this example, the reference-signal is a voltage equal to half the supply voltage $V_P$. Each output stage 217a, 217b comprises a respective output-stage-output-terminal 224a, 224b that each provide a respective output-signal $V_{OUTA}$, $V_{OUTB}$. The two output-signals $V_{OUTA}$, $V_{OUTB}$ can form a BD-modulated (both halves of the BTL configured amplifier 204 switch in phase) differential PWM signal $V_{OUTA} - V_{OUTB}$ that can drive the loud-speaker 202. Alternatively, the two output-signals $V_{OUTA}$, $V_{OUTB}$ can form an AD-modulated (the halves of the BTL configured amplifier 204 switch in opposite phase) differential PWM signal $V_{OUTA} - V_{OUTB}$.

The feedback-loop 220a, 220b of each analogue-feedback-circuit 214a, 214b connects the output-stage-output-terminal 224a, 224b to the virtual-ground-node-terminal 216a, 216b of the respective first-loop-integrator 213a, 213b. Each feedback-loop 220a, 220b may comprise a respective feedback-resistor $R_{FBA}$, $R_{FBB}$ 222a, 222b. Each feedback-loop 220a, 220b is configured to receive the output signals $V_{OUTA}$, $V_{OUTB}$ and provide a respective feedback-signal to the virtual-ground-node-terminal 216a, 216b of the respective first-loop-integrator 213a, 213b. In this example the feedback-signals are feedback currents $I_{RFBA}$, $I_{RFBB}$ resulting from the feedback of the output signals $V_{OUTA}$, $V_{OUTB}$ through the respective feedback-resistors $R_{FBA}$, $R_{FBB}$ 222a, 222b. The two feedback-currents $I_{RFBA}$, $I_{RFBB}$ are summed with the respective IDAC-currents $I_{PWMA}$, $I_{PWMB}$ at the virtual-ground-node-terminal 216a, 216b of the respective first-loop-integrator 213a, 213b.

A requirement for stability of the analogue-feedback-circuits 214a, 214b of FIG. 2 may be that the amplitude of each IDAC-current $I_{PWMA}$, $I_{PWMB}$ is larger than the amplitude of the respective feedback-current $I_{RFBA}$, $I_{RFBB}$.

$$I_{DACREF} \cdot R_{FB} > \frac{V_p}{2} \quad (1)$$

The supply-voltage $V_P$ of the amplifier 204 can have a wide range of values, especially when the amplifier 204 is supplied by a DC-DC boost converter as shown in FIG. 1. The maximum value of the supply voltage can be used to calculate the IDAC reference current $I_{DACREF}$. Once $I_{DACREF}$ is determined, the (conversion) gain of the audio path is fixed and becomes independent of the supply voltage $V_P$.

Figure 5:
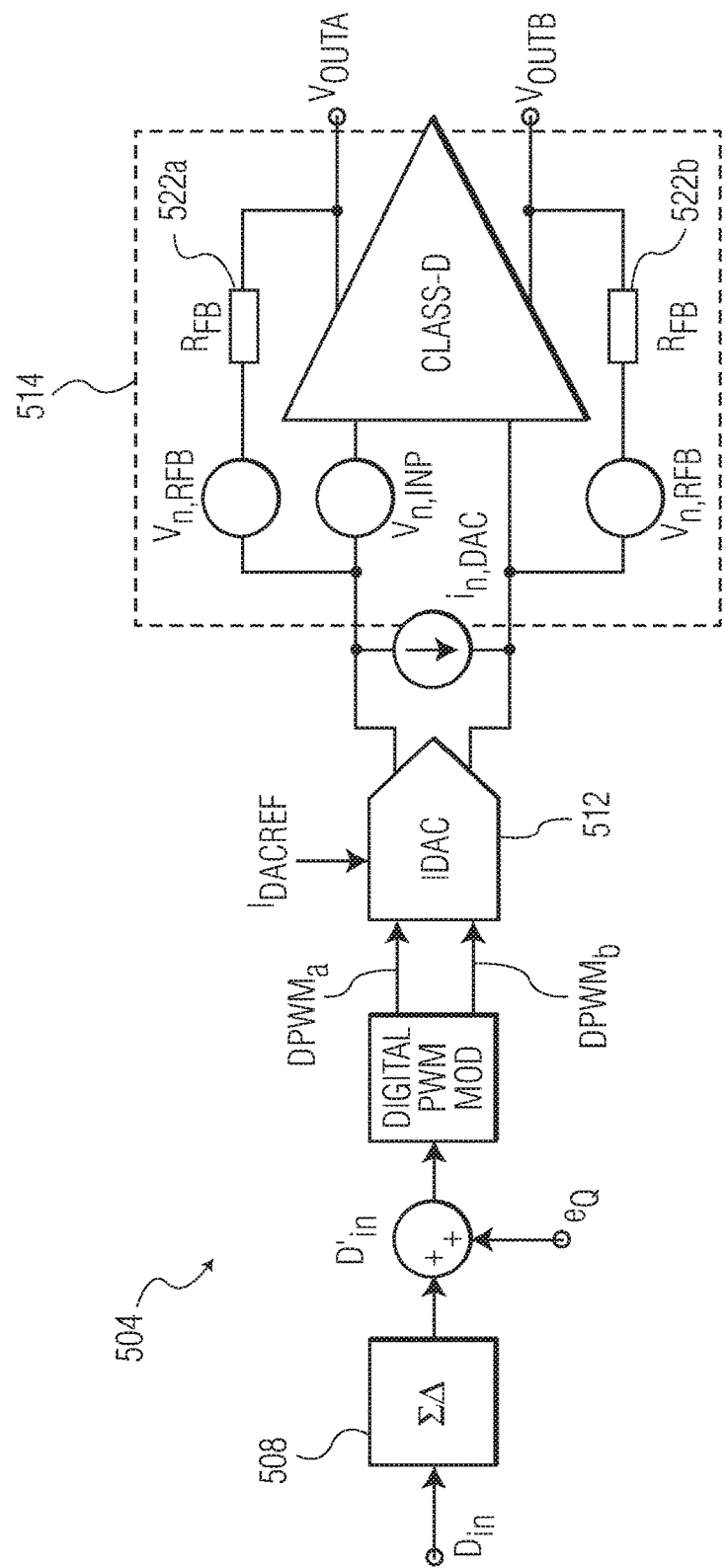
FIG. 5 illustrates the different noise contributors in the audio path of a digital audio amplifier.

FIG. 5 illustrates the different noise contributors in the audio path of a digital audio amplifier 504. Features of FIG. 5 that are also shown in FIG. 2 are given corresponding reference numbers in the 500 series and will not necessarily be described again here. The output-noise-voltage can be a key performance metric for audio power amplifiers. This can be particularly important in the audio frequency range of 20 Hz to 20 kHz. The sigma-delta modulator 508 at the input of the audio path reduces the 24-bit digital-input-signal $D_{in}$ to an 8-bit sampled-digital-input-signal $D'_{in}$. This reduction in resolution can create quantization noise $e_Q$. This quantization noise can be shaped out-of-band by a loop-filter (not shown) internal to the sigma-delta-modulator 508. The quantization noise $e_Q$ that remains in the audio bandwidth can be reduced by increasing the oversampling ratio or the order of the loop-filter in the sigma-delta-modulator 508. The oversampling ratio may be limited by the carrier-frequency of the digital-PWM-signals $DPWM_a$, $DPWM_b$. For example, the oversampling ratio may be limited to 8× the carrier-frequency. The order of the loop-filter can be increased to a value such that the contribution of the quantization-noise $e_Q$, to the output-noise-voltage of the amplifier 504, becomes insignificant relative to the other noise contributions illustrated in FIG. 5, such as thermal and 1/f noise contributions.

The noise contribution of the feedback-resistors $R_{FB}$ 522a, 522b and the equivalent input noise contribution of the first-loop-integrators of the analogue-feedback-circuit 514 are shown as noise voltage sources $V_{n,RFB}$ (2×) and $V_{n,INP}$ respectively. These noise sources appear across the output without amplification. The noise produced by the IDAC 512 is shown as a noise-current-source $i_{n,DAC}$. This noise-current-source $i_{n,DAC}$ is theoretically proportional to the square root of the IDAC-reference-current $I_{DACREF}$. The noise-current-source $i_{n,DAC}$ is multiplied by the resistance value of the feedback-resistors $R_{FBA}$, $R_{FBB}$ 522a, 522b to produce an IDAC-noise-voltage $V_{n,DAC}$ (not shown) at the amplifier output. The above can be summarised by the following equations:

$$v_{n,DAC} = 2 \cdot i_{n,DAC} \cdot R_{FB} \quad (2)$$

$$v_{n,DAC} = 2k \cdot \sqrt{I_{DACREF}} \cdot R_{FB} \quad (3)$$

In a typical design this contribution of the IDAC noise-voltage-source $V_{n,DAC}$ is the most dominant in the output-noise-voltage of the amplifier 504. The output-noise-voltage of the amplifier 504 can therefore be reduced by reducing the dominant noise contribution from the IDAC noise-voltage $V_{n,DAC}$. This may be achieved by reducing the resistance value of the feedback resistors $R_{FB}$ 522a, 522b and/or reducing the IDAC-reference-current $I_{DACREF}$. However, this may violate equation 1 and lead to instability in the amplifier 504, particularly for a high supply voltage $V_p$. To maintain stability, the resistance value of the feedback resistors $R_{FB}$ 522a, 522b can be decreased and the reference-current $I_{DACREF}$ increased by the same factor. In this way, the product of the two values on the left-hand side of equation 1 remains fixed. This can result in the IDAC noise-voltage $v_{n,DAC}$ being reduced as it is proportional to the resistance value of the feedback resistors $R_{FB}$ 522a, 522b and the square-root of the reference-current $I_{DACREF}$. This translates to a rule of thumb in analogue design that a factor of two reduction in noise requires four times more power.

The dominant contribution of the IDAC noise-voltage $v_{n,DAC}$, depends upon the digital-PWM-signal received by the IDAC. As illustrated in FIG. 4, the digital-PWM-signal DPWM produced by the digital-PWM-modulator of FIG. 2 switches between a value of ±1. The analogue-currents $I_{PWMA}$, $I_{PWMB}$ produced by the IDAC of FIG. 2 will have the same profile as the digital-PWM-signals $DPWM_a$, $DPWM_b$ but with a magnitude equal to the IDAC-reference-current, $\pm I_{DACREF}$. This leads to the dependence of the IDAC noise-voltage $v_{n,DAC}$, on the value of the IDAC-reference-current, illustrated in equation 3.

An aspect of the present disclosure is to provide an audio amplifier with reduced output-noise. As will be discussed below, this can be achieved by using an alternative modulation scheme that results in a lower average value digital signal being received by the DAC. This results in the DAC providing a lower average value analogue-signal, which may result in lower DAC noise-voltage $v_{n,DAC}$.

Figure 6A:
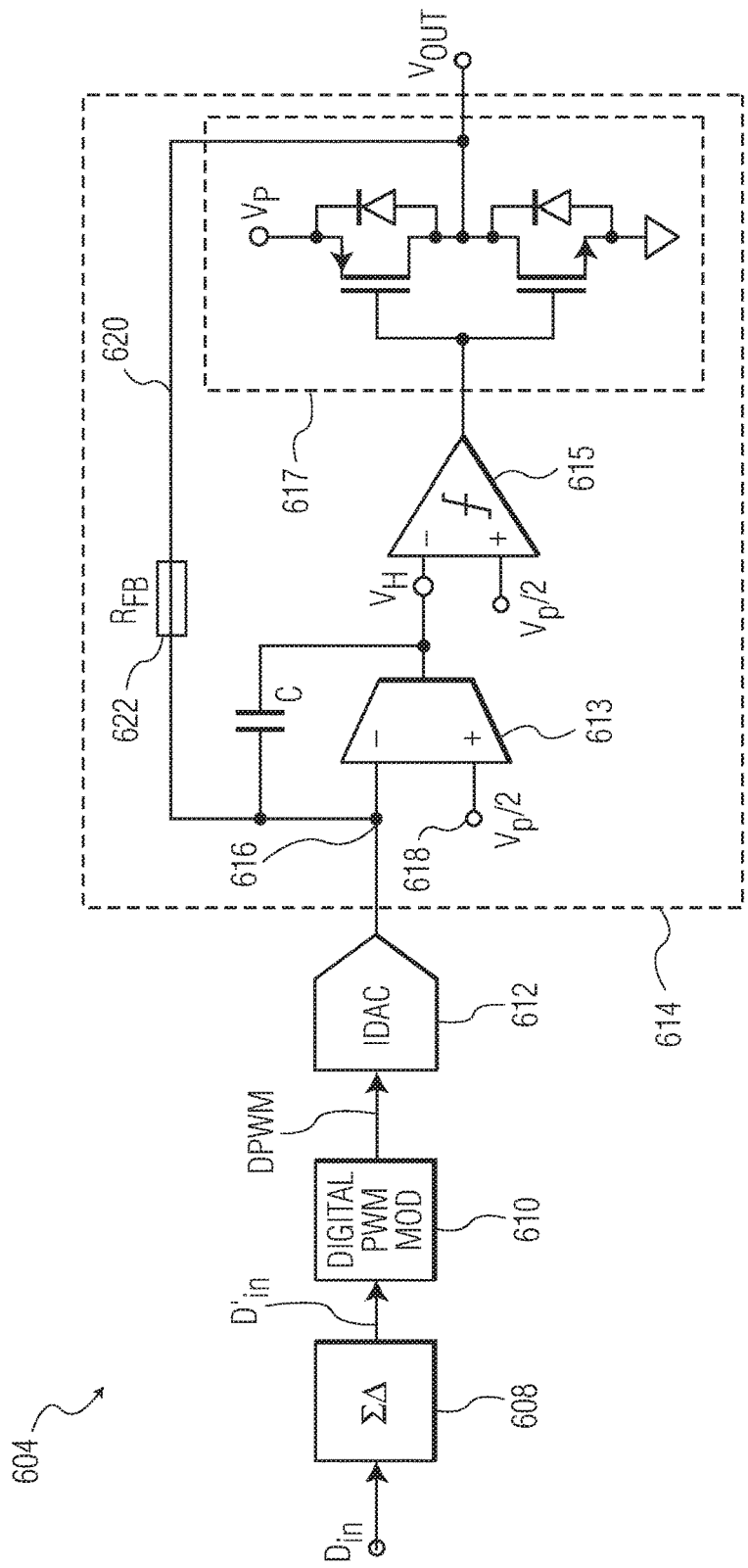
FIGS. 6A to 6C illustrate examples of audio amplifiers.
Figure 6B:
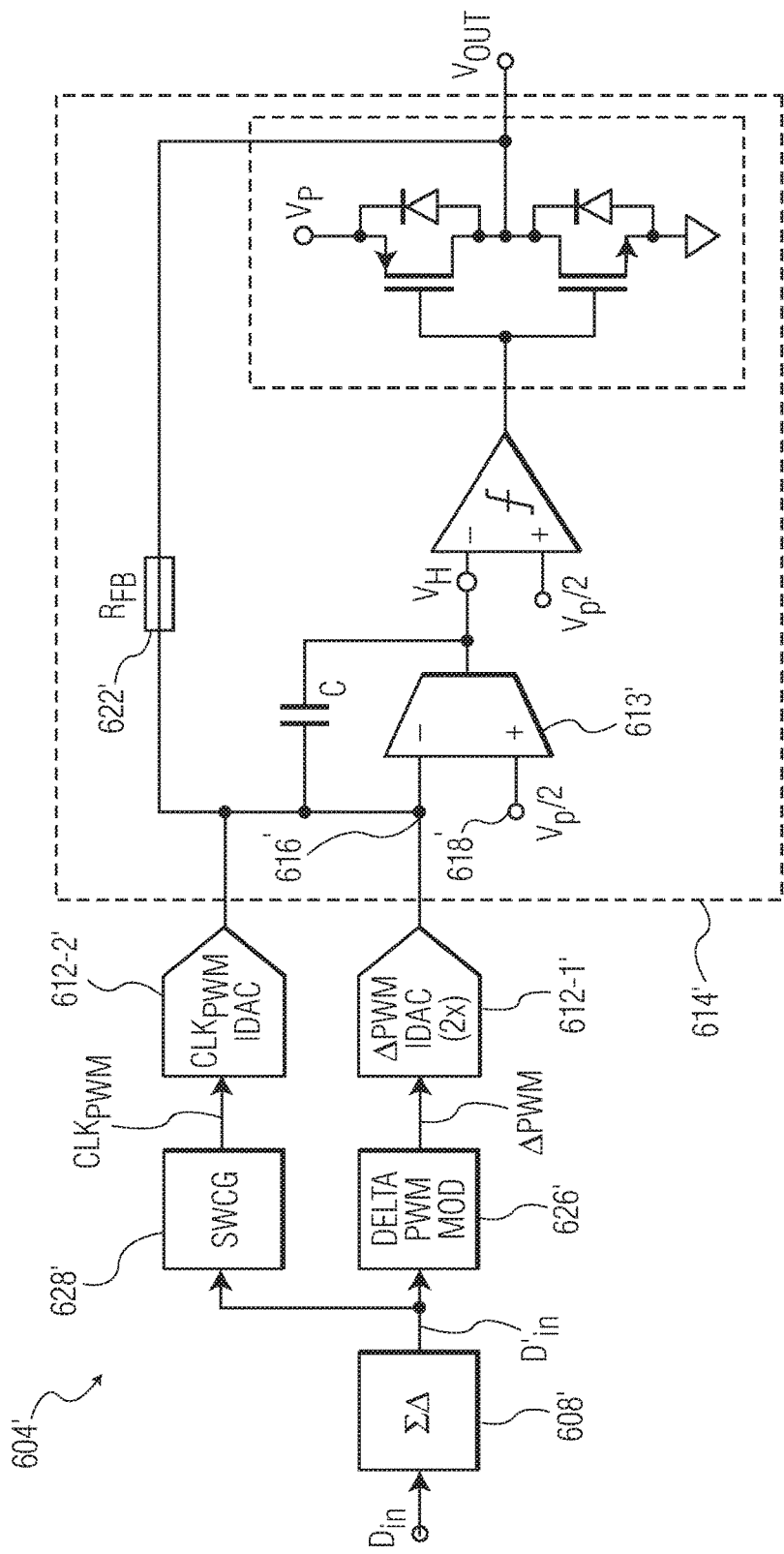
Figure 6C:
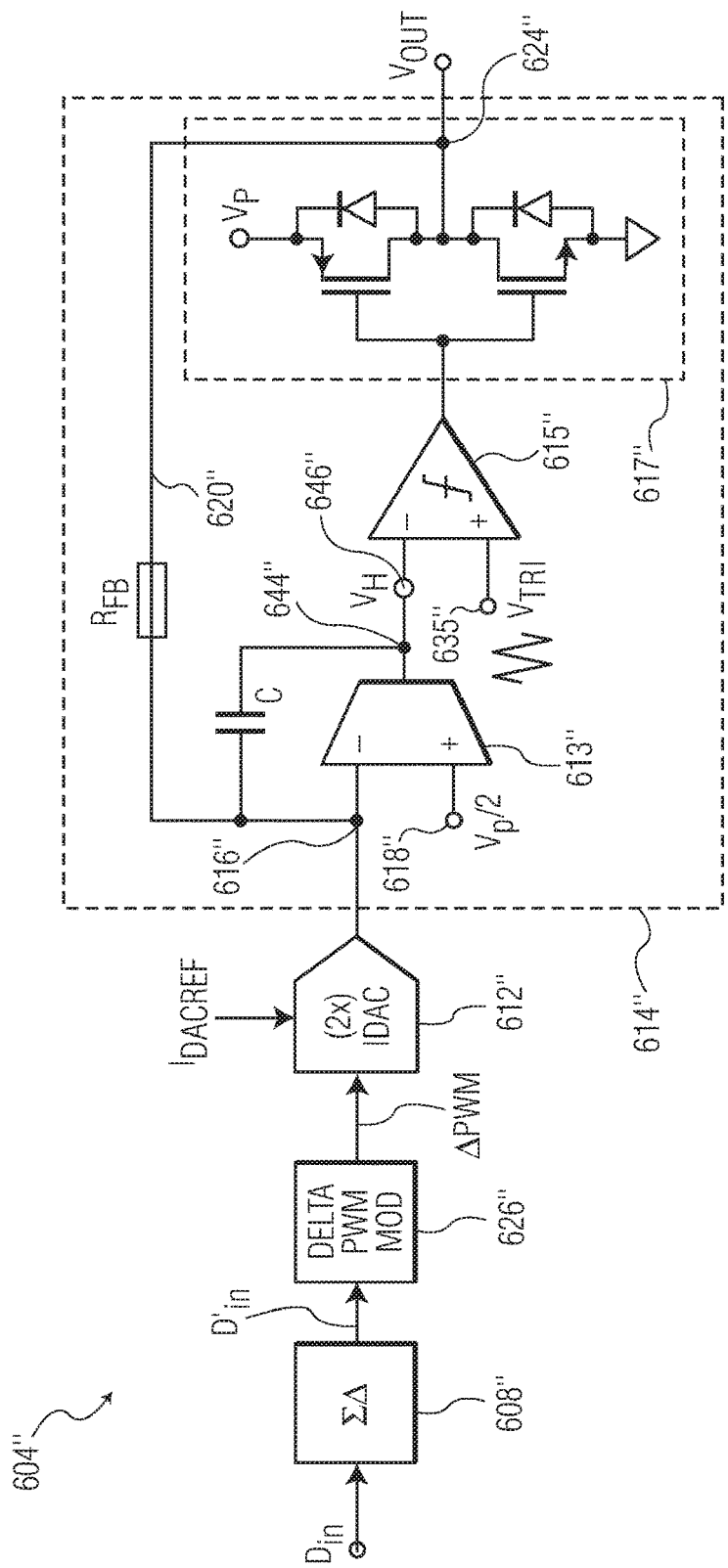

FIGS. 6A to 6C illustrate examples of audio amplifiers 604, 604', 604". Features of FIG. 6A to 6C that are also shown in FIG. 2 are given corresponding reference numbers in the 600 series and will not necessarily be described again here.

FIG. 6A depicts a simplified, first-order, single-ended version with the direct PWM architecture of the amplifier shown in FIG. 2. The analogue-feedback-circuit 614 of the amplifier 604 is referred to as first order as it only includes a first-loop-integrator 613 (and not any further loop-integrators). The amplifier 604 is referred to as single-ended because it is not in the BTL configuration. The amplifier 604 comprises a digital-PWM-modulator 610 for receiving a sampled-digital-input-signal $D'_{in}$ from the sigma-delta-modulator 608. The digital-PWM-modulator 610 can produce a digital-PWM-signal DPWM in a similar manner to that depicted in FIG. 4.

FIG. 6B illustrates an amplifier 604' with equivalent functionality to that of FIG. 6A, in which the digital-PWM-modulator 610 of FIG. 6A has been replaced by a delta-PWM-modulator 626' and a square-wave-carrier-signal-generator 628', in parallel with each other. Both the delta-PWM-modulator 626' and the square-wave-carrier-signal-generator 628' drive a respective DAC: ΔPWM-DAC 612'-1 and $CLK_{PWM}$-DAC 612'-2.

The square-wave-carrier-generator 628' generates a square-wave-carrier-signal $CLK_{PWM}$ that is a 1 bit square-wave. The square-wave-carrier-signal $CLK_{PWM}$ represents a carrier component of a digital-pulse-width-modulation of a sampled-digital-input-signal $D'_{in}$ such as the digital-PWM-signal DPWM of FIG. 6A. In this example, the square-wave-carrier-signal $CLK_{PWM}$ is equivalent to the digital-PWM-signal DPWM of FIG. 6A for a sampled-digital-input-signal $D'_{in}$ of zero. The square-wave-carrier-signal $CLK_{PWM}$ has a frequency equal to the carrier frequency of the digital-PWM-signal DPWM of FIG. 6A.

The delta-PWM-modulator 626' generates a delta-PWM-signal ΔPWM from the sampled-digital-input-signal $D'_{in}$. The delta-PWM-signal ΔPWM is representative of the difference between: (i) a digital-pulse-width-modulation of the sampled-digital-input-signal $D'_{in}$, such as the digital-PWM-signal DPWM of FIG. 6A; and (ii) the square-wave-carrier-signal $CLK_{PWM}$. In this way, the delta-PWM-signal ΔPWM represents a signal component of the digital-PWM-signal DPWM for a given sampled-digital-input-signal $D'_{in}$. The delta-PWM-signal ΔPWM may be proportional to the sampled-digital-input-signal $D'_{in}$. The delta-PWM-signal ΔPWM is a three-level-signal in this example. Further details of these signals will be described below with reference to FIGS. 7A-7C.

The delta-PWM-modulator 626' receives the sampled-digital-input-signal $D'_{in}$ from the delta-sigma-modulator 608'. The delta-PWM-modulator 626' processes the sampled-digital-input-signal $D'_{in}$ and a modulator-triangular-signal TRI to generate the delta-PWM-signal ΔPWM as will be discussed in detail below. The delta-PWM-modulator 626' may compare the sampled-digital-input-signal $D'_{in}$ to the modulator-triangular-signal TRI using a modulator-comparator (not shown). The delta-PWM-modulator 626' may generate the delta-PWM-signal ΔPWM directly from the comparison of the sampled-digital-input-signal $D'_{in}$ and the modulator-triangular-signal TRI. Alternatively, the delta-PWM-modulator 626' may generate the delta-PWM-signal ΔPWM following one or more additional steps after the comparison of the sampled-digital-input-signal $D'_{in}$ and the modulator-triangular-signal TRI. The modulator-triangular-signal TRI may be generated in the delta-PWM-modulator 626' or may be provided from an external source.

The delta-PWM-modulator 626' may also generate the digital-PWM signal DPWM from the sampled-digital-input-signal $D'_{in}$ as part of the process of generating the delta-PWM-signal ΔPWM. The delta-PWM-modulator 626' may generate the digital-PWM-signal DPWM based on the method illustrated in FIG. 4. That is, the delta-PWM-modulator 626' may generate the digital-PWM-signal DPWM by comparing the sampled-digital-input-signal $D'_{in}$ to the modulator-triangular-signal TRI. The delta-PWM-modulator 626' may generate the delta-PWM-signal ΔPWM based on the difference between (i) the square-wave-carrier-signal $CLK_{PWM}$ and (ii) the digital-PWM-signal DPWM. For example, the delta-PWM-modulator 626' may generate the delta-PWM-signal ΔPWM by subtracting the square-wave-carrier-signal $CLK_{PWM}$ from the digital-PWM-signal DPWM.

The square-wave-carrier-signal $CLK_{PWM}$ and the delta-PWM-signal ΔPWM are received respectively by the $CLK_{PWM}$-DAC 612'-2 and the ΔPWM-DAC 612'-1 and converted to analogue-signals. In this embodiment, the two DACs are IDACS. The current from the ΔPWM-IDAC 612'-1 is added to the current from the $CLK_{PWM}$-IDAC 612'-2 and the current from the feedback-resistor $R_{FB}$ 622' at the virtual-ground-node-terminal 616' of the first-loop-integrator 613'. The first-loop-integrator 613' integrates the received analogue-signal to produce a loop-integrator-output-signal $V_H$. The integration is a linear operation in this example. As a result, the addition of the square-wavecarrier-signal $CLK_{PWM}$ at the virtual-ground-node-terminal 616' of the first-loop-integrator 613' is equivalent to adding a triangular-reference-signal $V_{TRI}$ after the first-loop-integrator 613'. This equivalent configuration of the amplifier 604' is shown in FIG. 6C.

FIG. 6C is an example embodiment of an amplifier 604" according to an aspect of the present disclosure. The square-wave-carrier-signal-generator 628' and associated DAC 612-2' of FIG. 6B have been removed. The function of the square-wave-carrier-signal-generator 628' and associated DAC 612-2' is replicated by coupling a triangular-reference-signal $V_{TRI}$ to a comparator-reference-terminal 635" of the comparator 615".

The amplifier 604" comprises a delta-PWM-modulator 626" with the same functionality as described above in relation to the delta-PWM-modulator 626' of FIG. 6B.

The amplifier 604" may still generate the square-wave-carrier-signal $CLK_{PWM}$, for example in the delta-PWM-modulator 626". Alternatively, the amplifier 604" may receive the square-wave-carrier-signal $CLK_{PWM}$ from an external source. The square-wave-carrier-signal $CLK_{PWM}$ may be used to generate the delta-PWM-signal ΔPWM. The square-wave-carrier-signal $CLK_{PWM}$ may be used to generate the triangular-reference-signal $V_{TRI}$.

The addition of the triangular-reference-signal $V_{TRI}$ after the first-loop-integrator 613" is equivalent to the addition of the square-wave-carrier-signal $CLK_{PWM}$ at the input of the first-loop-integrator 613". The triangular-reference-signal $V_{TRI}$ may be generated by a first order integration of a square wave signal, such as the square-wave-carrier-signal $CLK_{PWM}$. However, such processing does not require the square-wave-signal to be processed by an IDAC 612", as is the case in FIG. 6B.

The IDAC 612" is configured to receive the delta-PWM-signal ΔPWM from the delta-PWM-modulator 626" and provide a three-level-analogue-signal in the form of a three-level IDAC-current. The IDAC 612" is a three-level or 1.5-bit IDAC. In other examples, a three-level-DAC other than an IDAC 612" may be configured to receive the delta-PWM-signal ΔPWM from the delta-PWM-modulator 626" and provide a three-level-analogue-signal.

The amplifier 604" further comprises an analogue-feedback-circuit 614". The analogue-feedback-circuit 614" comprises a first-loop-integrator 613"; a comparator 615"; a feedback-loop 620" and an output stage 617". A virtual-ground-node-terminal 616" of the first-loop-integrator 613" receives the three-level-analogue-signal from the IDAC 612" and a feedback-signal from the output-stage 617" via the feedback-loop 620". A reference-terminal 618" of the first-loop-integrator 613" is configured to receive a reference-signal ($V_F/2$ in this example). An integrator-output-terminal 644" of the first-loop-integrator 613" is configured to provide a loop-integrator-output-signal $V_H$.

A comparator-input-terminal 646" of the comparator 616" is configured to receive the loop-integrator-output-signal $V_H$ from the first-loop-integrator 613". The comparator compares the loop-integrator-output-signal $V_H$ to the triangular-reference-signal $V_{TRI}$ received at the comparator-reference-terminal 635". As a result, the comparator 615" can provide a drive-signal suitable for driving the output-stage 617". The output stage 617" comprises an output-stage-output-terminal 624" that provides an output-signal $V_{OUT}$, which can be used to drive a loud-speaker.

An aspect of the present disclosure, depicted in FIG. 6C, is to separate the digital-PWM-signal DPWM generated in the amplifier of FIG. 6A into (i) a carrier component: the square-wave-carrier-signal $CLK_{PWM}$; and (ii) a signal component: the delta-PWM-signal ΔPWM, and inject the two components at different locations in the amplifier 604". The signal component, (delta-PWM-signal ΔPWM) is received at the IDAC 612". The carrier component is received at the comparator-reference-terminal 635" as the triangular-reference-signal $V_{TRI}$, which is equivalent to the integral of the square-wave-carrier-signal $CLK_{PWM}$. In this way, the audio amplifier of FIG. 6C can have an improved noise performance compared to the audio amplifiers of FIGS. 6A and 6B. In the direct-PWM architecture of FIGS. 2 and 6A, both the signal and carrier components are injected into the analogue-feedback-circuit. The remaining performance parameters of the three audio amplifiers can be nominally equivalent.

FIG. 6C may have an improved noise performance because only the signal component (delta-PWM-signal ΔPWM) is processed by the IDAC 612". The delta-PWM-signal ΔPWM is a three-level-signal that switches between values of +N, 0 and −N, where N is an integer. For example N may be 1, 2 or another value. Therefore, the IDAC-current provided by the IDAC 612" can have one of three values: $+N \times I_{DACREF}$, $-N \times I_{DACREF}$ or 0. Such a three-level IDAC 612" is generally referred to as a 1.5-bit IDAC. The noise current injected at the IDAC 612" becomes proportional to the sampled-digital-input-signal $D'_{in}$. Therefore, at a zero value of the sampled-input-signal $D'_{in}$, zero noise is injected at the IDAC 612". As a result, the previously dominant noise source contribution of the IDAC 612" can become negligible when $D'_{in}$ is zero, and can be reduced when $D'_{in}$ is not zero.

The equivalent noise contribution of the triangular-reference-signal $V_{TRI}$ (equivalent to the carrier component) is reduced by the gain of the analogue-feedback-circuit 614". The loop filter order or loop integrator order of the analogue-feedback-circuit 614" may be increased by adding additional loop-integrators. The gain of the additional integrators can reduce the equivalent input noise contribution of the triangular-reference-signal $V_{TRI}$, resulting in a further improvement in noise performance of the amplifier 604" of FIG. 6C. The noise contribution of the carrier component is therefore suppressed by the additional integrators and may become irrelevant.

The amplifier 604" of FIG. 6C has an additional degree of freedom relative to the amplifier 604 of FIG. 6A. That is, the amplitude of triangular-reference-signal $V_{TRI}$ can be increased independently of the reference-current $I_{DACREF}$. This degree of freedom can be used to improve the stability of the analogue-feedback-circuit 614".

Figure 7C:
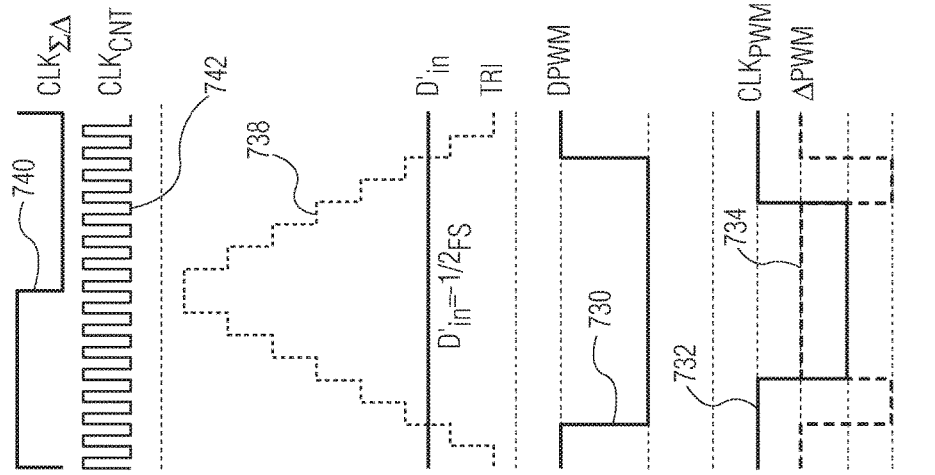
FIGS. 7A, 7B and 7C example embodiments of the decomposition of a digital-PWM-signal.
Figure 7B:
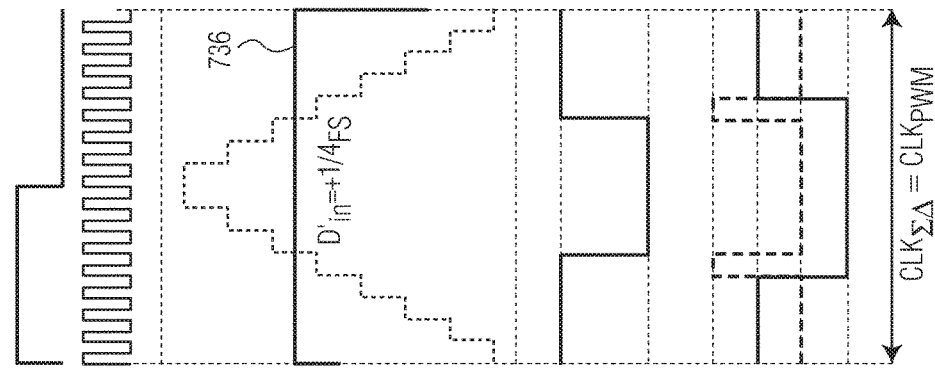
Figure 7A:
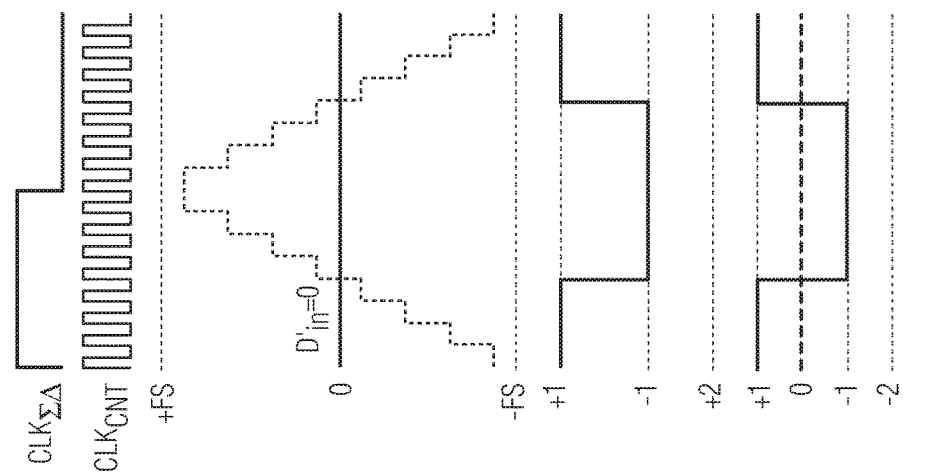

FIGS. 7A, 7B and 7C illustrate an example embodiment of the decomposition of a digital-PWM-signal DPWM 730 into a superposition of (i) a carrier component: the square-wave-carrier-signal $CLK_{PWM}$ 732; and (ii) a signal component: the delta-PWM-signal ΔPWM 734. The digital-PWM-signal DPWM 730 is identical to that of FIG. 4 with the corresponding sampled-digital-input-signal $D'_{in}$ 736. The modulator-triangular signal TRI 738, sigma-delta-clock-signal $CLK_{\Sigma\Delta}$ 740 and modulator-triangular-clock-signal $CLK_{CNT}$ 742 are also shown for reference. The modulator-triangular signal TRI 738 has a range of values that are: greater than or equal to a negative-full-scale-value −FS, and less than or equal to a positive-full-scale-value +FS.

FIGS. 7A, 7B and 7C illustrate graphically an example of how the delta-PWM-modulator of FIG. 6B and FIG. 6C may generate the delta-PWM-signal ΔPWM 734, according to an embodiment of the present disclosure. The figures illustrate how the digital-PWM-signal DPWM 730 can be generated by comparison of the modulator-triangular signal TRI 738 to the sampled-digital-input-signal $D'_{in}$. Then the delta-PWMsignal ΔPWM 734 can be generated based on the difference between the digital-PWM-signal DPWM 730 and the square-wave-carrier-signal $CLK_{PWM}$ 732.

In this example, the digital-PWM-signal DPWM 730 is a 1-bit signal that switches between values +1 and −1 with a constant transition rate or carrier frequency. The square-wave-carrier-signal $CLK_{PWM}$ 732 has a fixed 50% duty-cycle, and the same carrier-frequency as the digital-PWM-signal DPWM 730. The square-wave-carrier-signal $CLK_{PWM}$ varies between values of +1 and −1. The square-wave-carrier-signal $CLK_{PWM}$ is equivalent to the digital-PWM-signal DPWM produced from a zero-value sampled-digital-input-signal $D'_{in}$, as shown in FIG. 7A.

The period of the modulator-triangular-signal TRI 738 determines the carrier-frequency of both the digital-PWM-signal DPWM 730 and the square-wave-carrier-signal $CLK_{PWM}$ 732. In this example the period of the modulator-triangular-signal TRI 738 is equal to the period of the sigma-delta-clock-signal $CLK_{\Sigma\Delta}$ 440.

The delta-PWM-signal ΔPWM 734 may be generated based on the difference between the digital-PWM-signal DPWM 730 and the square-wave-carrier-signal $CLK_{PWM}$ 732. The square-wave-carrier-signal $CLK_{PWM}$ 732 represents the carrier component of the digital-PWM-signal DPWM 730. As a result, the square-wave-carrier-signal $CLK_{PWM}$ 732 is in phase with, or has a zero phase-shift from the digital-PWM-signal DPWM 730 as shown in the figures. That is, a single period of the digital-PWM-signal DPWM 730 is time-aligned with a single period of the square-wave-carrier-signal $CLK_{PWM}$ 732, such that the peaks and troughs of the digital-PWM-signal DPWM 730 correspond in time to the peaks and troughs of the square-wave-carrier-signal $CLK_{PWM}$ 732. The delta-PWM-signal ΔPWM 734 can then be generated by subtracting the square-wave-carrier-signal $CLK_{PWM}$ 732 from the digital-PWM-signal DPWM 730.

In an alternative arrangement, there may be a phase-shift of π radians between the square-wave-carrier-signal $CLK_{PWM}$ 732 and the digital-PWM-signal DPWM 730. In this case, the peaks of the digital-PWM-signal DPWM 730 will correspond in time to the troughs of the square-wave-carrier-signal $CLK_{PWM}$ 732, and vice-versa. The delta-PWM-signal ΔPWM 734 may then be generated by the addition of the square-wave-carrier-signal $CLK_{PWM}$ 732 and the digital-PWM-signal DPWM 730. The π radians phase-shift is equivalent to negating the square-wave-carrier-signal $CLK_{PWM}$ 732 shown in FIGS. 7B and 7C. Therefore, adding the phase-shifted (negated) square-wave-carrier-signal $CLK_{PWM}$ 732 to the digital-PWM-signal DPWM 730 is equivalent to subtracting the non-phase-shifted square-wave-carrier-signal $CLK_{PWM}$ 732 from the digital-PWM-signal DPWM 730.

The phase of the digital-PWM-signal DPWM 730 is related to the phase of the modulator-triangular-signal TRI 738. In the example of FIGS. 7A, 7B and 7C, the phase of the square-wave-carrier-signal $CLK_{PWM}$ 732 is therefore also related to the phase of the modulator-triangular-signal TRI 738. In this example, the square-wave-carrier-signal $CLK_{PWM}$ 732 and the digital-PWM-signal DPWM 730 are both π radians phase-shifted relative to the modulator-triangular-signal TRI 738, such that the peaks of both the digital-PWM-signal DPWM 730 and the square-wave-carrier-signal $CLK_{PWM}$ 732 correspond in time to the troughs of the modulator-triangular-signal TRI 738 and vice-versa. In other words, a transition in the square-wave-carrier-signal $CLK_{PWM}$ 732 corresponds in time to the modulator-triangular-signal TRI 738 having a middle-value (which is zero in this example).

As can be seen in FIG. 7C, the delta-PWM-signal ΔPWM 734 consists of pulses with a pulse-width proportional to the sampled-digital-input-signal $D_{in}$ 736. The pulses can be considered relatively narrow, and either start or end on a rising of falling edge of the square-wave-carrier-signal $CLK_{PWM}$ 732. The delta-PWM-signal ΔPWM 734 is a three-level signal, which in this example switches between values of +2, 0 and −2.

FIG. 7A illustrates that the digital-PWM-signal DPWM 730 has a 50% duty-cycle when the sampled-digital-input-signal $D'_{in}$ 730 is zero. The digital-PWM-signal DPWM 730 and the square-wave-carrier-signal $CLK_{PWM}$ are therefore equivalent and the corresponding delta-PWM-signal ΔPWM 734 is zero.

FIG. 7B illustrates the same signals for when the sampled-digital-input-signal $D'_{in}$ 736 is greater than zero. The duty-cycle of the digital-PWM-signal DPWM 730 is larger than 50%. The corresponding delta-PWM-signal ΔPWM 734 is a series of positive pulses adjacent to the edges of the square-wave-carrier-signal $CLK_{PWM}$ 732.

When the digital-input-signal $D_{in}$ 736 is less than zero, as shown in FIG. 7C, the duty-cycle of the digital-PWM-signal DPWM 730 is smaller than 50% and the delta-PWM-signal ΔPWM 734 becomes a series of negative pulses.

Generating the delta-PWM-signal ΔPWM as the difference between the digital-PWM-signal DPWM and the square-wave-carrier-signal $CLK_{PWM}$, as described with respect to FIG. 7B, can introduce an undesired interaction between the delta-PWM-signal ΔPWM and the analogue-feedback-circuit 614" in some applications. FIGS. 10A, 10B, 10C, 11, 12, 13A, 13B, and 13C described below, relate to alternative ways of generating the delta-PWM-signal ΔPWM 734 directly from the comparison of the sampled-digital-input-signal $D'_{in}$ to the modulator-triangular-signal TRI. That is, the intermediate step of generating the digital-PWM-signal DPWM 730 which is described with reference to FIGS. 7A, 7B and 7C, may not be required.

Figure 8C:
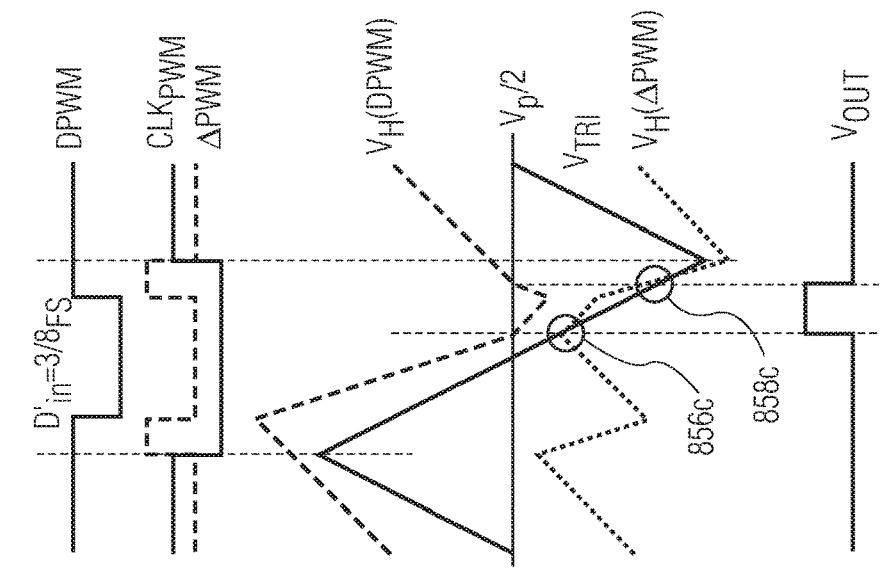
FIGS. 8A, 8B and 8C show the modulated signals, loop integrator signals and output signals for different levels of the sampled-digital-input-signal for the two amplifiers of FIGS. 6a and 6c.
Figure 8B:
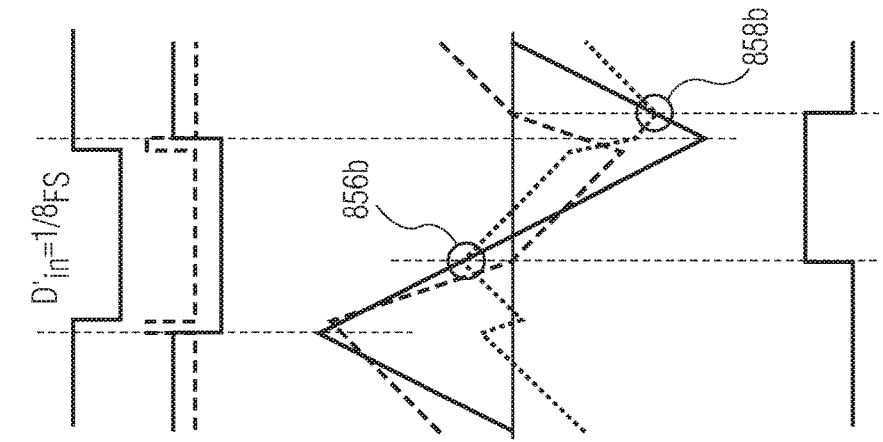
Figure 8A:
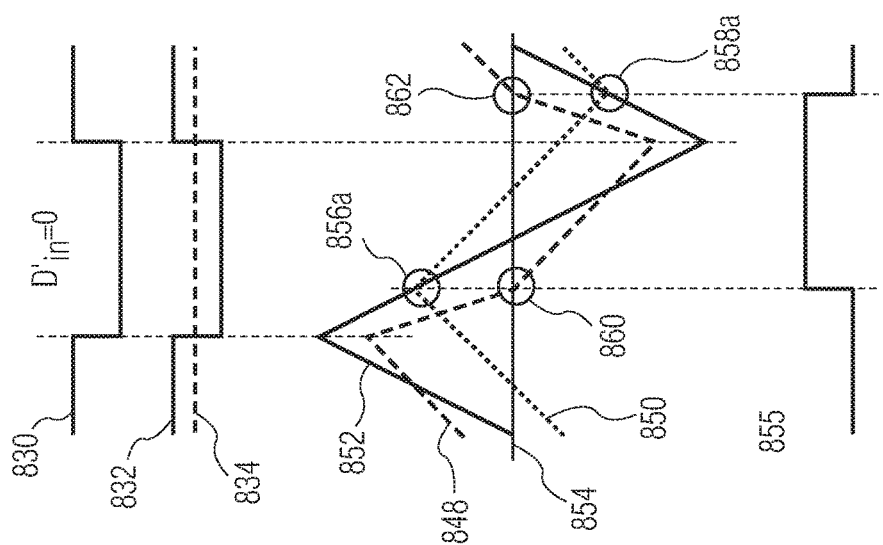

FIGS. 8A, 8B and 8C show the modulated signals, loop integrator signals and output signals for different levels of the sampled-digital-input-signal $D'_{in}$ for the two amplifiers of FIGS. 6A and 6C. In the example of FIG. 8, the delta-PWM-modulator of FIG. 6c generates the d6Cta-PWM-signal ΔPWM by subtracting the square-wave-carrier-signal $CLK_{PWM}$ from the digital-PWM-signal DPWM as illustrated in FIGS. 7A, 7B and 7C.

The upper area of FIGS. 8A, 8B and 8C show: (i) the digital-PWM-signal DPWM 830 that is processed by the circuit of FIG. 6A; and (ii) the delta-PWM-signal ΔPWM 834 and the square-wave-carrier-signal $CLK_{PWM}$ 832 (where DPWM=ΔPWM+$CLK_{PWM}$) that are processed by the circuit of FIG. 6C.

The middle area of FIGS. 8A, 8B and 8C show the signals received at the comparator-input-terminal and the comparator-reference-terminal of FIGS. 6A and 6C. These signals include:
(i) A digital-loop-integrator-output-signal $V_H$(DPWM) 848 provided by the first-loop-integrator of FIG. 6A;
(ii) a fixed-level-signal Vp/2 854, equal to half the supply voltage, received at the comparator-reference-terminal of FIG. 6A;
(iii) A delta-loop-integrator-output-signal $V_H$(ΔPWM) 850 provided by the first-loop-integrator of FIG. 6C; and
(iv) the triangular-reference-signal $V_{TRI}$ 852 received at the comparator-reference-terminal of FIG. 6C.

The triangular-reference-signal $V_{TRI}$ 852 is related to the two loop-integrator-output-signals $V_H(DPWM)$ 848, $V_H(\Delta PWM)$ 850 in that $V_H(DPWM)=V_{TRI}-V_H(\Delta PWM)$.

The lower area of FIGS. 8A, 8B and 8C show the output-signal $V_{OUT}$ 855, which is the same for the output-stage of each of the amplifiers of FIGS. 6A and 6C. The output-signal $V_{OUT}$ 855 switches at times corresponding to ΔPWM-intersections 856, 858, where the delta-loop-integrator-output-signal $V_H(\Delta PWM)$ 850 crosses the triangular-reference-signal $V_{TRI}$ 852 for FIG. 6C. The ΔPWM-intersections 860, 862 occur at equivalent times to DPWM-intersections 860, 862 where the digital-loop-integrator-output-signal $V_H(DPWM)$ 848 crosses the fixed-level-signal $V_p/2$ 854 for FIG. 6A. The propagation delay of the comparator depends on the slope or gradient of the signals it receives at the comparator-input-terminal and comparator-reference-terminal.

FIG. 8A shows the response of the amplifiers of FIGS. 6A and 6C when the sampled-digital-input-signal $D'_{in}$ is zero. In this case the digital-PWM-signal DPWM 830 has a 50% duty-cycle and the delta-PWM-signal ΔPWM 834 is zero. The delta-loop-integrator-output-signal $V_H(\Delta PWM)$ 850 is a symmetrical triangular wave and at the (encircled) ΔPWM-intersections 856a, 858a the delta-loop-integrator-output-signal $V_H(\Delta PWM)$ 850 and the triangular-reference-signal $V_{TRI}$ 852 have opposite slopes. That is, one of the signals has a positive slop, and the other signal has a negative slope, leading into the ΔPWM-intersections 856a, 858a.

FIG. 8B shows the response of the amplifiers of FIGS. 6A and 6C when the sampled-digital-input-signal $D'_{in}$ is increased to $\frac{1}{8}_{FS}$ (one eighth of the full scale). The delta-PWM-signal ΔPWM 834 produces two narrow pulses that each cause a temporary slope change in the delta-loop-integrator-output-signal $V_H(\Delta PWM)$ 850 for the duration of the pulse. However, the duration of the pulses is sufficiently short that the temporary slope change does not affect the slopes of the delta-loop-integrator-output-signal $V_H(\Delta PWM)$ 850 at the ΔPWM-intersections 856b, 858b. As a result, the propagation delay of the comparator will remain the same as in the zero-input case.

FIG. 8C shows the response of the amplifiers of FIGS. 6A and 6C when the sampled-digital-input-signal $D'_{in}$ is further increased to $\frac{3}{8}_{FS}$. In this case the slopes of the delta-loop-integrator-output-signal $V_H(\Delta PWM)$ 850 and the triangular-reference-signal $V_{TRI}$ 852 at the first ΔPWM-intersection 856c are the same as FIGS. 8A and 8B. However, at the second ΔPWM-intersection 858c, the slopes of the delta-loop-integrator-output-signal $V_H(\Delta PWM)$ 850 and the triangular-reference-signal $V_{TRI}$ 852 are different to those at the second ΔPWM-intersection 858a 858b in sections (a) and (b). That is the slopes are both negative at the second ΔPWM-intersection 858c. The difference between the slopes may be mathematically identical to the previous cases, however the propagation delay of a real comparator may be different. As a result, there may be an abrupt change in propagation delay. In this example, there may be an abrupt change in propagation delay at a sampled-digital-input-signal $D'_{in}$ level of $\frac{1}{4}_{FS}$. Such an abrupt change in propagation delay can trigger a settling response in the analogue-feedback-circuit of the amplifier of FIG. 6C and result in an undesirable cross-over type distortion in the output of the audio amplifier.

Figure 9C:
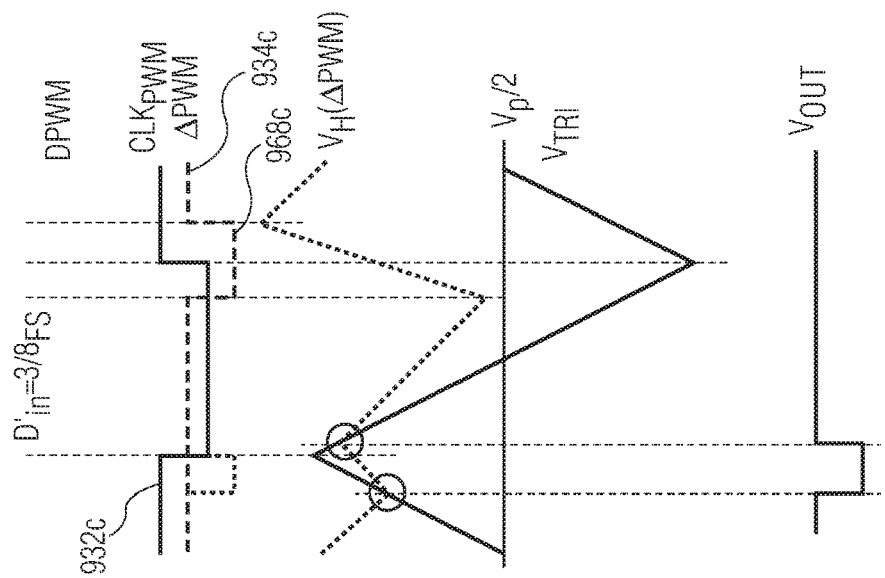
FIGS. 9A, 9B and 9C illustrate an altered delta-PWM-signal that can be generated by a delta-PWM-modulator, according to an aspect of the present disclosure.
Figure 9B:
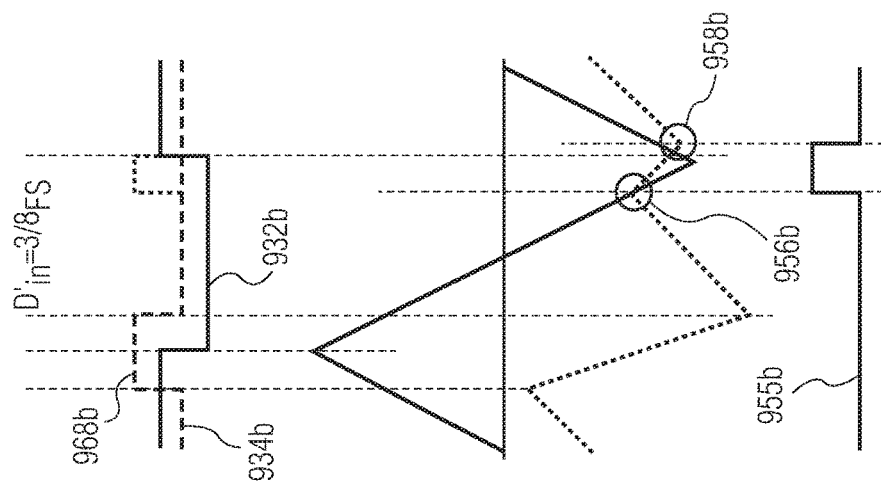
Figure 9A:
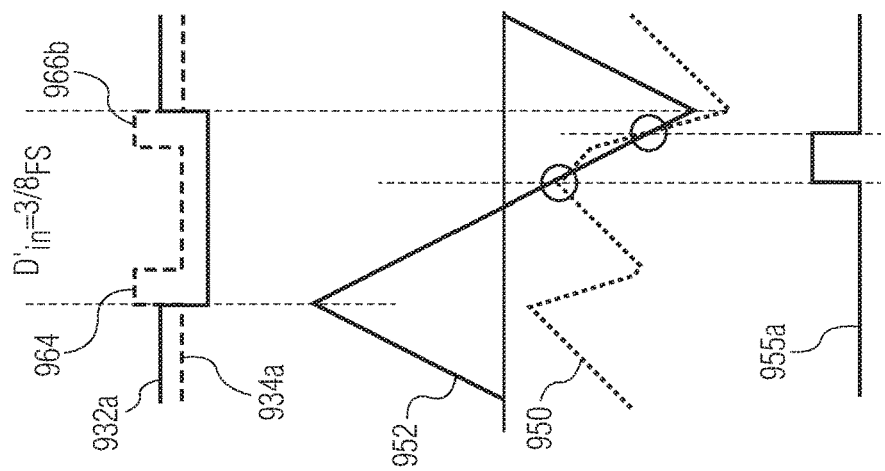

FIGS. 9A, 9B and 9C an altered delta-PWM-signal ΔPWM that can be generated by a delta-PWM-modulator, according to an aspect of the present disclosure. Some of the signals from FIG. 8C are repeated in FIG. 9A for convenience. The delta-PWM-signal ΔPWM 934a has two positive pulses 964, 966, one at each of the rising edge and falling edge of the square-wave-carrier-signal $CLK_{PWM}$ 932a.

FIG. 9B, the second pulse 966 of the delta-PWM-signal ΔPWM 934b has been shifted to before the first pulse 964 to form a single, merged ΔPWM-pulse 968b centred on the falling edge of the square-wave-carrier-signal $CLK_{PWM}$ 932b. A description of how such a merged ΔPWM-pulse 968b can be generated is provided below in relation to FIGS. 10A, 10B, 10C, 11, 12, 13A, 13B and 13C. The merged delta-PWM-signal ΔPWM 934b has the same average value as the original delta-PWM-signal ΔPWM 934a. As a result, the output-pulse of the output-signal $V_{OUT}$ 955b maintains the same pulse-width as the original output-pulse of the output-signal $V_{OUT}$ 955a. The position in time of the output-pulse may change by a small amount but should not negatively affect the performance of the amplifier. An advantage of the merged delta-PWM-signal ΔPWM 934b is that the slopes of the delta-loop-integrator-output-signal $V_H(\Delta PWM)$ 950 and the triangular-reference-signal $V_{TRI}$ 952 at the ΔPWM-intersections 956b, 958b are now consistent and independent of the level of the sampled-digital-input-signal $D'_{in}$. As a result, the propagation delay of the comparator will remain more consistent.

FIG. 9C illustrates a similar implementation of the merged delta-PWM-signal ΔPWM 934c for negative values of the sampled-digital-input-signal $D'_{in}$. The resulting merged ΔPWM-pulse 968c is centred on the rising edge of the square-wave-carrier-signal $CLK_{PWM}$. Locating the merged ΔPWM-pulses 968b, 968c on the edge of the square-wave-carrier-signal 932b, 932c, can enable the merged ΔPWM-pulses 968b, 968c to be separated in time from the ΔPWM-intersections 956, 958 of the delta-loop-integrator-output-signal $V_H(\Delta PWM)$ 950 and the triangular-reference-signal $V_{TRI}$ 952. As a result, the slopes of the delta-loop-integrator-output-signal $V_H(\Delta PWM)$ 950 and the triangular-reference-signal $V_{TRI}$ 952 at the ΔPWM-intersections 956, 958 are now consistent and independent of the level of the sampled-digital-input-signal $D'_{in}$. The propagation delay of the comparator will therefore also remain more consistent.

FIGS. 10A, 10B, 10C, 11, 12, 13A, 13B and 13C show graphically examples of how a delta-PWM-signal ΔPWM can be generated by a delta-PWM-modulator directly from a comparison of the sampled-digital-input-signal $D'_{in}$ with a modulator-triangular-signal TRI. The intermediate step of generating a digital-PWM-signal DPWM may not be required. Features of FIGS. 10A, 10B, 10C, 11, 12, 13A, 13B and 13C that are also shown in FIGS. 7A, 7B and 7C are given corresponding reference numbers in the 1000 to 1300 series and will not necessarily be described again.

Although a digital-PWM-signal DPWM may no longer be generated in the embodiments of FIGS. 10A, 10B, 10C, 11, 12, 13A, 13B and 13C, the generated delta-pulse-width-modulation-signal ΔPWM can still be considered as representative of the difference between the square-wave-carrier-signal $CLK_{PWM}$ and a digital-pulse-width-modulation of the sampled-digital-input-signal $D'_{in}$. Furthermore, such a digital-pulse-width-modulation of the sampled-digital-input-signal $D'_{in}$ can be in phase with, or have a zero phase-shift, from the square-wave-carrier-signal $CLK_{PWM}$.

In the examples of FIGS. 10A, 10B, 10C, 11, 12, 13A, 13B and 13C, the delta-PWM-signal ΔPWM is not generated from a digital-PWM-signal that in turn is generated from the modulator-triangular-signal TRI. As a result, an arbitrary phase-difference or time-offset may be introduced between the modulator-triangular-signal TRI and the square-wave-carrier-signal $CLK_{PWM}$. In the examples of FIGS.

10A, 10B, 10C, 11, 12, 13A, 13B and 13C, the modulator-triangular-signal TRI comprises a first-modulator-triangular-waveform $TRI_{POS}$ and a second-modulator-triangular-waveform $TRI_{NEG}$. In these examples, the phase-difference between the modulator-triangular-signal TRI and the square-wave-carrier-signal $CLK_{PWM}$ is such that the troughs of a first-modulator-triangular-waveform correspond in time to the falling edge of the square-wave-carrier-signal $CLK_{PWM}$; and the peaks of a second-modulator-triangular-waveform correspond in time to the rising edge of the square-wave-carrier-signal $CLK_{PWM}$. This can enable the locating of the merged ΔPWM-pulses 1064, 1066 on the rising and falling edges of the square-wave-carrier-signal $CLK_{PWM}$ 1032 described in relation to FIGS. 9B and 9C.

Figure 10A:
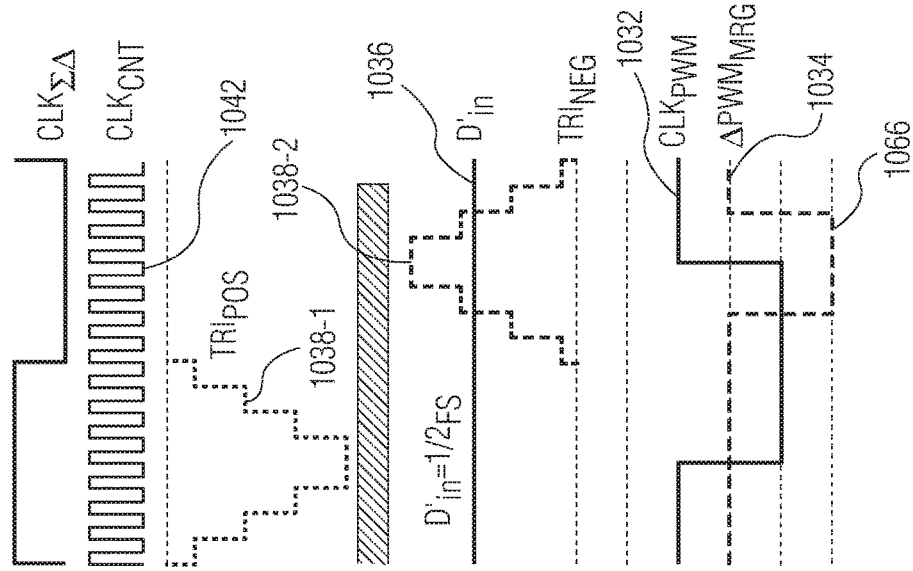
FIGS. 10A, 10B, 10C, 11, 12, 13A, 13B and 13C show graphically examples of how a delta-PWM-signal can be generated by a delta-PWM-modulator.
Figure 10B:
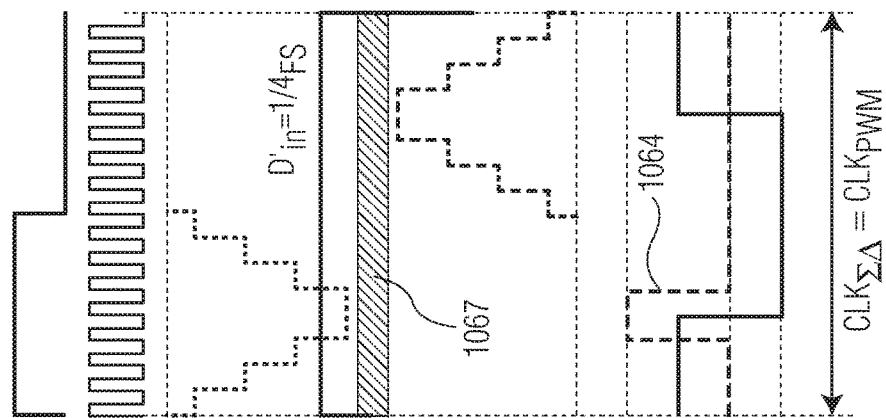
Figure 10C:
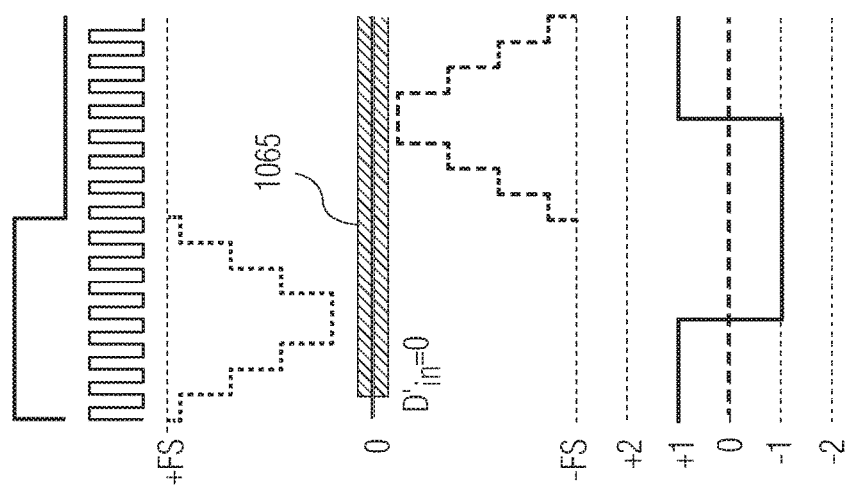

FIGS. 10A, 10B and 10C graphically illustrates an example of how the merged delta-PWM-signal ΔPWM of FIGS. 9B and 9C may be generated, according to an aspect of the present disclosure. The merged delta-PWM-signal $ΔPWM_{MRG}$ 1034 is generated by comparing the sampled-digital-input-signal $D'_{in}$ 1036 to a different type of modulator-triangular-signal TRI 1038.

The modulator-triangular-signal TRI 1038 comprises a first-modulator-triangular-waveform $TRI_{POS}$ 1038-1 and a second-modulator-triangular-waveform $TRI_{NEG}$ 1038-2. The first-modulator-triangular-waveform $TRI_{POS}$ 1038-1 and the second-modulator-triangular-waveform $TRI_{NEG}$ 1038-2 are staircase-signals. The signal-level ranges of the first-modulator-triangular-waveform $TRI_{POS}$ 1038-1 and the second-modulator-triangular-waveform $TRI_{NEG}$ 1038-2 do not overlap. As a result, there is a null-signal-range 1065 between the first-modulator-triangular-waveform $TRI_{POS}$ 1038-1 and the second-modulator-triangular-waveform $TRI_{NEG}$ 1038-2 that includes a zero-signal-level 1067 corresponding to a zero-value of the sampled-digital-input-signal $D'_{in}$ 1036.

During a first half of a period of the square-wave-carrier-signal 1032, the first-modulator-triangular-waveform $TRI_{POS}$ 1038-1 has a range of positive values that are: greater than zero, and less than or equal to a positive-full-scale-value +FS. The second-modulator-triangular-waveform $TRI_{NEG}$ 1038-2 can have a value (not shown) less than a negative-full-scale-value –FS. During a second half of the period of the square-wave-carrier-signal 1032, the first-modulator-triangular-waveform $TRI_{POS}$ 1038-1 can have a value (not shown) greater than the positive-full-scale-value +FS. The second-modulator-triangular-waveform $TRI_{NEG}$ 1038-2 has a range of negative values that are: less than zero, and greater than or equal to a negative-full-scale-value. In this way, the sampled-digital-input-signal $D'_{in}$ 1036 may not cross the second-modulator-triangular-waveform $TRI_{NEG}$ 1038-2 during the first half of the period of the square-wave-carrier-signal 1032. Similarly, the sampled-digital-input-signal $D'_{in}$ 1036 may not cross the first-modulator-triangular-waveform $TRI_{NEG}$ 1038-1 during the second half of the period of the square-wave-carrier-signal 1032.

The second-modulator-triangular-waveform 1038-2 corresponds to a reflected, time-shifted, version of the first-modulator-triangular-waveform 1038-1, wherein the reflection is about the zero-signal-level.

When the signal-level of the sampled-digital-input-signal $D'_{in}$ 1036 lies within the null-signal-range 1065, the delta-PWM-signal $ΔPWM_{MRG}$ 1034 will be zero. The null-signal-range can enable the generation of the delta-PWM-signal $ΔPWM_{MRG}$ 1034 without the generation of a digital-PWM-signal.

In FIG. 10A the sampled-digital-input-signal $D'_{in}$ 1036 is zero and therefore lies within the null-signal-range 1065. As a result, the sampled-digital-input-signal $D'_{in}$ 1036 does not cross either the first-modulator-triangular-waveform $TRI_{POS}$ 1038-1 or the second-modulator-triangular-waveform $TRI_{NEG}$ 1038-2, and the delta-PWM-signal $ΔPWM_{MRG}$ 1034 is zero.

In FIG. 10B, the sampled-digital-input-signal $D'_{in}$ 1036 is increased to $¼_{FS}$ and crosses the first-modulator-triangular-waveform $TRI_{POS}$ 1038-1 at two points. This results in a symmetrical, positive ΔPWM-pulse 1064 in the delta-PWM-signal $ΔPWM_{MRG}$ 1034 located on the falling edge of the square-wave-carrier-signal $CLK_{PWM}$ 1032. In this example, the positive ΔPWM-pulse 1064 in the delta-PWM-signal $ΔPWM_{MRG}$ 1034 is centred on the falling edge of the square-wave-carrier-signal $CLK_{PWM}$ 1032.

In FIG. 10C, the sampled-digital-input-signal $D'_{in}$ 1036 is reduced to $-½_{FS}$ and crosses second-modulator-triangular-waveform $TRI_{NEG}$ 1038-2 at two points. This results in a symmetrical, negative ΔPWM-pulse 1066 in the delta-PWM-signal $ΔPWM_{MRG}$ 1034 located on the rising edge of the square-wave-carrier-signal $CLK_{PWM}$ 1032. In this example, the negative ΔPWM-pulse 1066 in the delta-PWM-signal $ΔPWM_{MRG}$ 1034 is centred on the rising edge of the square-wave-carrier-signal $CLK_{PWM}$ 1032.

In this way, a pulse in the delta-PWM-signal $ΔPWM_{MRG}$ 1034 is located on an edge of the square-wave-carrier-signal $CLK_{PWM}$ 1032, optionally centred on the edge.

Inspection of FIGS. 10A, 10B and 10C indicate that the maximum pulse-width of the positive or negative merged ΔPWM-pulses 1064 1066 is limited to half the period of the square-wave-carrier-signal $CLK_{PWM}$ 1032. This is because the first-modulator-triangular-waveform $TRI_{POS}$ 1038-1 and the second-modulator-triangular-waveform $TRI_{NEG}$ 1038-2 each only have values that can be potentially intersected by the sampled-digital-input-signal $D'_{in}$ 1036, for half of the period of the square-wave-carrier-signal $CLK_{PWM}$ 1032. That is, as discussed above, the first-modulator-triangular-waveform $TRI_{POS}$ 1038-1 and the second-modulator-triangular-waveform $TRI_{NEG}$ 1038-2 each have a range of values that overlaps with a range of potential values of the sampled-digital-input-signal $D'_{in}$ 1036, for only a subset of the period of the square-wave-carrier-signal $CLK_{PWM}$ 1032. This maximum pulse-width may drive the analogue-feedback-circuit of FIG. 10C into clipping, so should accommodate the full range of the sampled-digital-input-signal $D'_{in}$ 1032.

In the examples of FIGS. 10A, 10B and 10C, the delta-PWM-signal $ΔPWM_{MRG}$ 1034 is a three-level signal with values of –2, 0 and +2. As a result, the area under the ΔPWM-pulses 1064, 1066, which is representative of the effective signal-resolution of the pulse, is limited to an integer multiple M of 2 (amplitude)×2 (periods of $CLK_{CNT}$)=4M. This effective signal-resolution, may be improved by reducing the amplitude or magnitude of the merged ΔPWM-pulses 1064 1066 in the delta-PWM-signal $ΔPWM_{MRG}$ 1034 to +1, such that the area under a ΔPWM-pulse becomes an integer multiple M of 1 (amplitude)×2 (periods of $CLK_{CNT}$)=2M. In which case, the pulse-width of the merged ΔPWM-pulses 1064 1066 should be doubled to maintain the same cycle average value in the delta-PWM-signal $ΔPWM_{MRG}$ 1034. As a result, a wider maximum pulse-width of the merged ΔPWM-pulses 1064 1066 can be used to accommodate the full range of the sampled-digital-input-signal $D'_{in}$ 1036.

Figure 11:
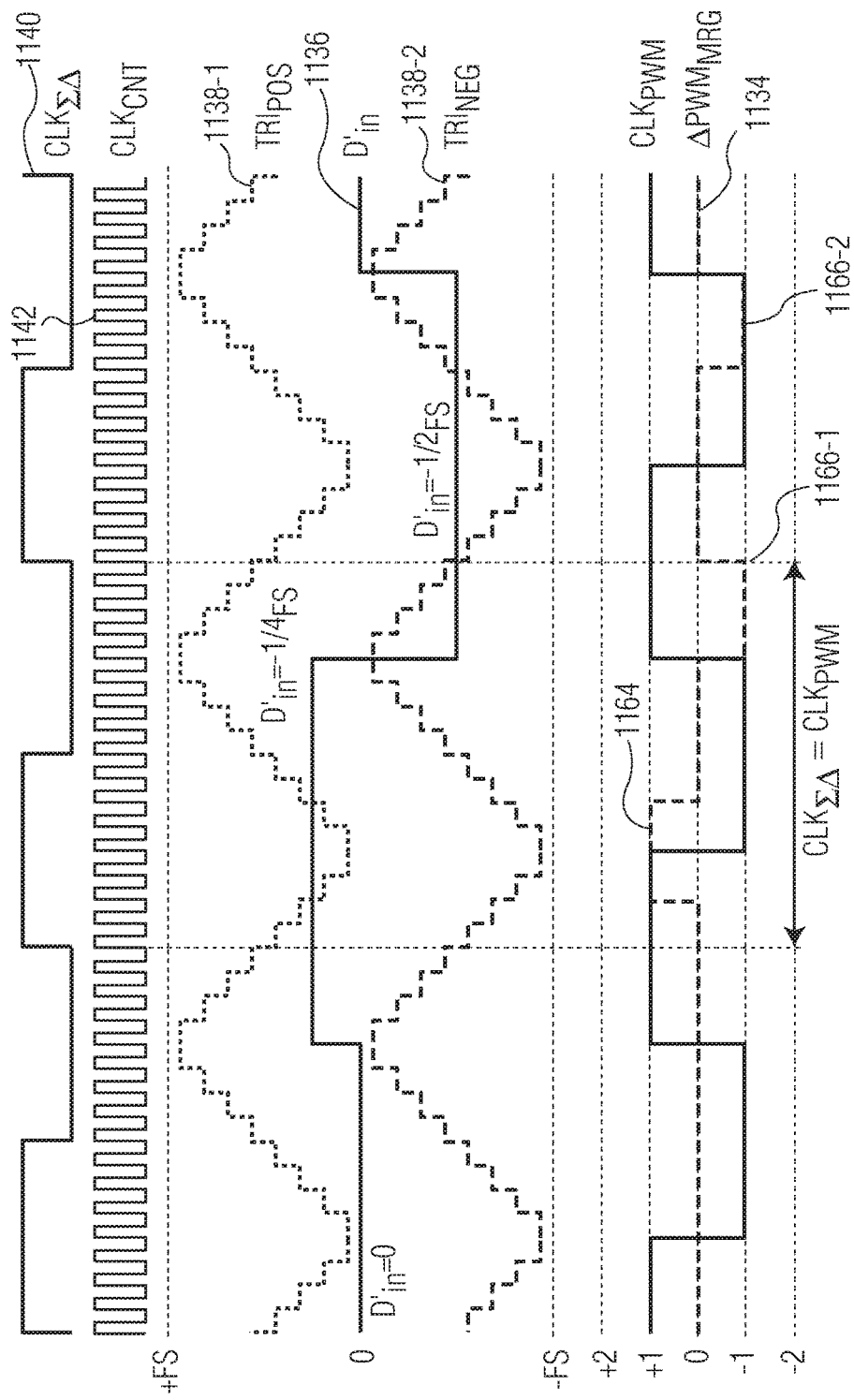

FIG. 11 graphically illustrates another example of how a lower amplitude delta-PWM-signal $ΔPWM_{MRG}$ 1134 may be generated, according to an aspect of the present disclosure. As in FIGS. 10A, 10B and 10C, the modulator-triangular-signal TRI 1138 comprises a first-modulator-triangular-waveform TRI$_{POS}$ 1138-1 and a second-modulator-triangular-waveform TRI$_{NEG}$ 1138-2. The first-modulator-triangular-waveform TRI$_{POS}$ 1138-1 and the second-modulator-triangular-waveform TRI$_{NEG}$ 1138-2 have similar properties to those described in relation to FIGS. 10A, 10B and 10C with the following exceptions:

(i) the magnitude of both signals is now continuously greater than zero and less than or equal to the respective full-scale value +FS, −FS;

(ii) both signals now have double the width-range for which they may be intercepted by the sampled-digital-input-signal D'$_{in}$ 1136, relative to FIGS. 10A, 10B and 10C. That is, the first-modulator-triangular-waveform TRI$_{POS}$ 1038-1 and the second-modulator-triangular-waveform TRI$_{NEG}$ 1038-2 each have range of values that overlaps with a range of potential values of the sampled-digital-input-signal D'$_{in}$ 1036, for the entire period of the square-wave-carrier-signal CLK$_{PWM}$ 1132; and (iii) both signals now have double the signal-level-resolution relative to FIGS. 10A, 10B and 10C. This is because there are twice as many transitions in the modulator-triangular-clock-signal CLK$_{CNT}$ 1142, that are available for the length of time that the modulator-triangular-waveforms 1038-1 1038-2 have values that can be potentially intersected by the sampled-digital-input-signal D'$_{in}$ 1036.

Doubling the width-range for which the two modulator-triangular-waveform TRI$_{POS}$ TRI$_{NEG}$1138-1 1138-2 may be intercepted by the sampled-digital-input-signal D'$_{in}$ 1136 doubles the maximum pulse-width of the merged ΔPWM-pulses 1164 1166 to one period of the square-wave-carrier-signal CLK$_{PWM}$ 1132. This enables the magnitude of the merged ΔPWM-pulses 1164, 1166 to be reduced to ±1 whilst maintaining the cycle average value in the delta-PWM-signal ΔPWM$_{MRG}$ 1134.

FIG. 11 shows the resulting merged ΔPWM-pulses 1164, 1166 in the delta-PWM-signal ΔPWM$_{MRG}$ 1134. The delta-PWM-signal ΔPWM$_{MRG}$ 1134 is now a three-level-signal that switches between values of +1, 0 and −1. If the delta-PWM-modulator of FIG. 6C provides the delta-PWM-signal ΔPWM$_{MRG}$ 1134 to the IDAC, the resultant IDAC-current will be a three-level-current with values of +I$_{DACREF}$, −I$_{DACREF}$ or 0.

Doubling the pulse-width range of the merged ΔPWM-pulses 1164 1166 whilst maintaining the frequency of the modulator-triangular-clock-signal CLK$_{CNT}$ 1142 doubles the effective signal-resolution of the merged ΔPWM-pulses 1164 1166. Therefore, the signal-level-resolution of the sampled-digital-input-signal D'$_{in}$ 1136 may also be doubled. If the sampled-digital-input-signal D'$_{in}$ 1136 is provided by a preceding delta-sigma-modulator, then doubling in signal-level-resolution will reduce the quantization noise by 6 dB.

In FIG. 11, the sampled-digital-input-signal D'$_{in}$ 1136 is sampled at times corresponding to each top of the first-modulator-triangular-waveform TRI$_{POS}$ 1138-1, which also corresponds to each top of the second-modulator-triangular-waveform TRI$_{NEG}$ 1138-2. In this way, the sampled-digital-input-signal D'$_{in}$ 1136 and either of the modulator-triangular-signals TRI 1138-1, 1138-2 should not intersect more than twice in one period of the square-wave-carrier-signal CLK$_{PWM}$ 1132. To enable this, the sigma-delta-clock-signal CLK$_{ΣΔ}$ 1140 in FIG. 11 has been shifted in time relative to FIGS. 10A, 10B and 10C. A transition in the sigma-delta-clock-signal CLK$_{ΣΔ}$ 1140 in FIG. 11 is aligned with a peak in the modulator-triangular-signal TRI 1138. As a result, a new sample/value of the sampled-digital-input-signal D'$_{in}$ 1136 commences at a time corresponding to each top of each of the first-modulator-triangular-waveform TRI$_{POS}$ 1138-1 and the second-modulator-triangular-waveform TRI$_{NEG}$ 1138-2. In an alternative embodiment, a transition in the sigma-delta-clock-signal CLK$_{ΣΔ}$ 1140 can be aligned with a trough in the modulator-triangular-signal TRI 1138.

Figure 12:
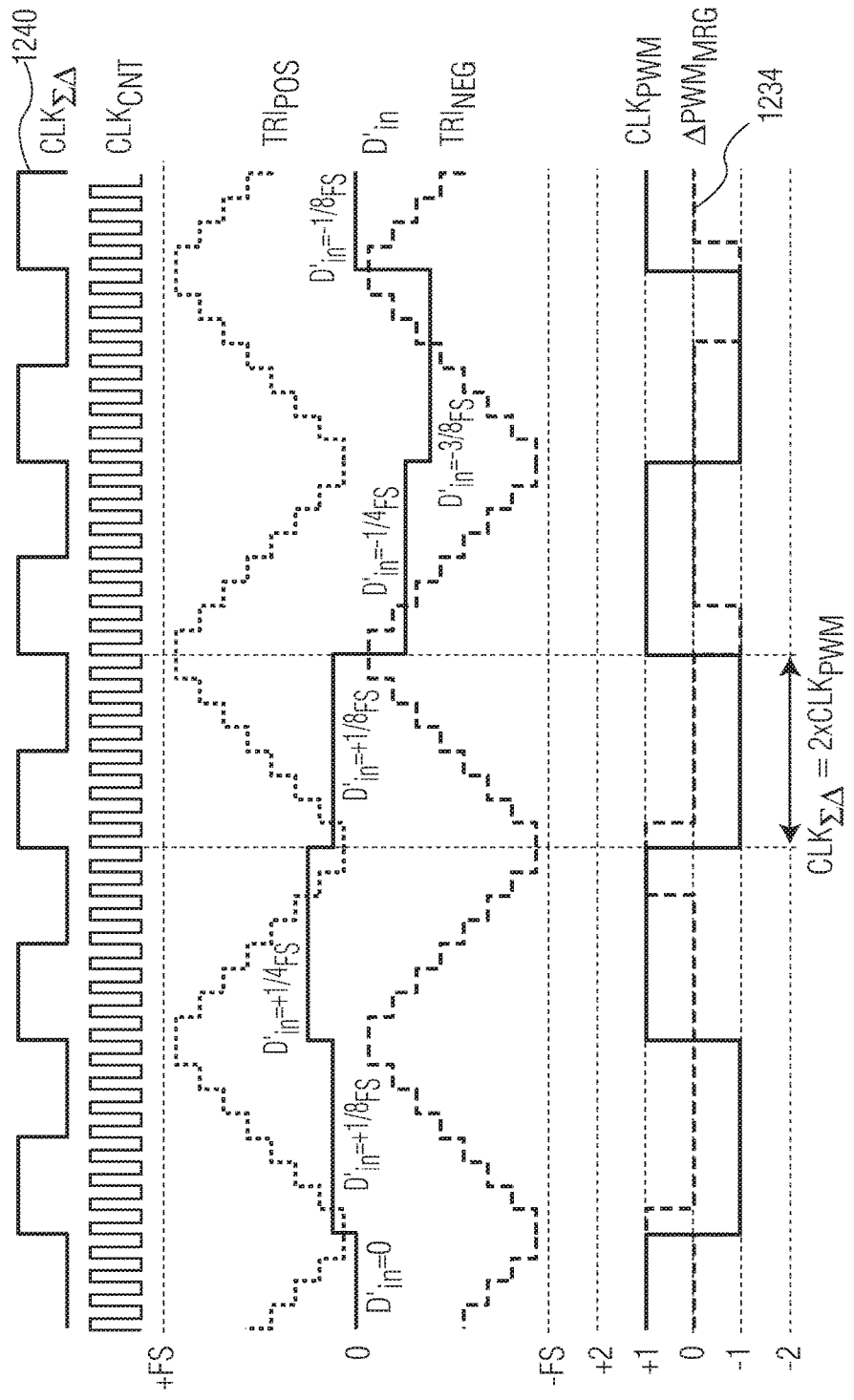

FIG. 12 illustrates graphically an example way of generating a lower noise delta-PWM-signal ΔPWM$_{MRG}$ 1234, according to an aspect of the present disclosure. The signals in FIG. 12 are the same as those of FIG. 11 with the exception that the frequency of the sigma-delta-clock-signal CLK$_{ΣΔ}$ 1240 has been doubled. This leads to a further increase in resolution and decrease of in-band quantization noise. As a result, a new sample of the sampled-digital-input-signal D'$_{in}$ 1236 commences at a time corresponding to each top and bottom of each of the first-modulator-triangular-waveform TRI$_{POS}$ 1238-1 and the second-modulator-triangular-waveform TRI$_{NEG}$ 1238-2.

For a zero value of the sampled-digital-input-signal D'$_{in}$, the delta-PWM-signal ΔPWM$_{MRG}$1234 has a zero value, and therefore a downstream IDAC (such as the IDAC of FIG. 6C) produces an IDAC-current of zero. Thus, there are no resulting transitions in the IDAC-current. The transition rate of the IDAC-current is therefore dependent on the delta-PWM-signal ΔPWM, which in turn depends on the sampled-digital-input-signal D'$_{in}$. Therefore, the transition rate of the IDAC-current cannot be considered constant, that is, the IDAC-current does not have a constant transition rate (CTR).

Figures 13A, 13B, 13C:
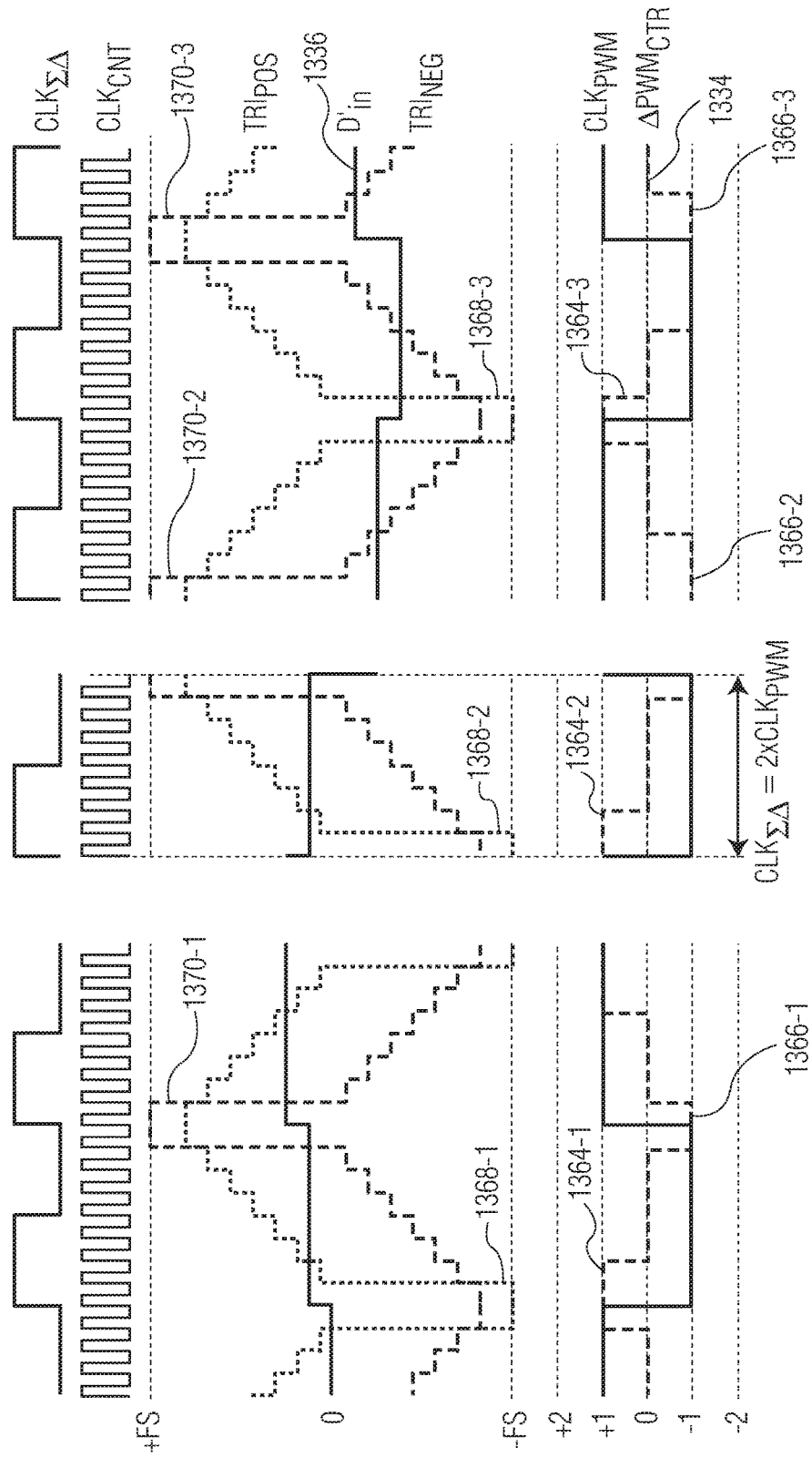

FIGS. 13A, 13B and 13C illustrate graphically an example way of generating a CTR delta-PWM-signal ΔPWM$_{CTR}$ 1334 that has a constant transition rate (CTR), according to an aspect of the present disclosure.

Using a CTR delta-PWM-signal ΔPWM$_{CTR}$ 1334, which has a CTR, can reduce inter-symbol interference (ISI). ISI can be a source of distortion in 1-bit DACs.

A CTR can be introduced to the delta-PWM-signal ΔPWM$_{CTR}$ 1334 by introducing a minimum pulse-width for both positive and negative merged ΔPWM-pulses 1364, 1366. That is, the delta-PWM-signal ΔPWM$_{CTR}$ 1334 includes a pulse at each potential transition in the value of the sampled-digital-input-signal D'$_{in}$ 1336, irrespective of the value of the sampled-digital-input-signal D'$_{in}$ 1336. The pulse can be either positive or negative, and has at least a minimum pulse-width.

The minimum pulse-width is introduced in this example by modifying the shape of the first-modulator-triangular-waveform TRI$_{POS}$ 1338-1 and the second-modulator-triangular-waveform TRI$_{NEG}$ 1338-2 as shown in FIGS. 13A, 13B and 13C. The first-modulator-triangular-waveform TRI$_{POS}$ 1338-1 includes negative protrusions 1368 extending from each trough of the first-modulator-triangular-waveform TRI$_{POS}$ 1338-1 to a signal level less than the negative-full-scale-value −FS. Similarly, the second-modulator-triangular-waveform TRI$_{NEG}$ 1338-2 includes positive protrusions 1370 extending from each peak of the second-modulator-triangular-waveform TRI$_{NEG}$ 1338-2 to a signal level greater than the positive-full-scale-value +FS.

That is, the first-modulator-triangular-waveform TRI$_{POS}$ and the second-modulator-triangular-waveform TRI$_{NEG}$ each have a range that covers the entire range of values of the sampled-digital-input-signal D'$_{in}$ 1336. That is, in this example, both the first-modulator-triangular-waveform TRI$_{POS}$ and the second-modulator-triangular-waveform TRI$_{NEG}$ have a range of values that are: greater than or equal to a negative-full-scale-value, and less than or equal to a positive-full-scale-value. In other examples, only one of the first-modulator-triangular-waveform $TRI_{POS}$ and the second-modulator-triangular-waveform $TRI_{NEG}$ may have a range that covers the entire range of values of the sampled-digital-input-signal $D'_{in}$ 1336.

The negative protrusions 1368 at the bottoms or troughs of the first-modulator-triangular-waveform $TRI_{POS}$ 1338-1 ensure an intersection with the sampled-digital-input-signal $D'_{in}$1336 for any value of $D'_{in}$. Zero or negative values of the sampled-digital-input-signal $D'_{in}$1336 will result in a minimum pulse-width positive merged ΔPWM-pulse 1364-3. This results in a constant transition rate of positive merged ΔPWM-pulses 1364 for all signal levels of the sampled-digital-input-signal $D'_{in}$ 1336. Similarly, the positive protrusions 1370 at the tops or peaks of the second-modulator-triangular-waveform $TRI_{NEG}$ 1338-2 ensure an intersection with the sampled-digital-input-signal $D'_{in}$ 1336 for any value of $D'_{in}$. Zero or positive values of the sampled-digital-input-signal $D'_{in}$ 1336 will result in a minimum pulse-width negative merged ΔPWM-pulse 1366-1. This results in a constant transition rate of negative merged ΔPWM-pulses for all signal levels of the sampled-digital-input-signal $D'_{in}$1336. The resulting delta-PWM-signal $\Delta PWM_{CTR}$ 1334 has a CTR of positive and negative pulses. This may reduce or eliminate ISI and any resulting distortion produced by the IDAC.

For a zero value of the sampled-digital-input-signal $D'_{in}$ 1336, the constant transition rate delta-PWM-signal $\Delta PWM_{CTR}$ 1334 will consist of alternating positive and negative merged ΔPWM-pulses 1364, 1366, with a fixed width/duration (in this example a minimum width/duration). The noise contribution of the IDAC current noise may now be higher than for the modulation schemes of FIGS. 7A, 7B, 7C and 10A, 10B, 10C-12 due to the minimum pulse-width of the merged ΔPWM-pulses 1364, 1366 of the delta-PWM-signal $\Delta PWM_{CTR}$1334. However, the noise contribution of the IDAC current noise can still be negligible as the minimum pulse-width merged ΔPWM-pulses 1364, 1366 can have a very small duty-cycle.

The protrusions that are shown in FIGS. 13A, 13B and 13C can be considered as being added to the modulator-triangular-waveforms of FIG. 12. However, it will be appreciated that similar protrusions can be added to other triangular-waveforms disclosed herein, including the waveforms of FIGS. 10A, 10B, 10C and 11.

One or more of the circuits disclosed herein, including the delta-PWM-modulators disclosed herein, can be implemented in an amplifier that has a bridge-tied-load (BTL) configuration, such as the ones illustrated in FIGS. 1, 2 and 4. As will be discussed below, this can lead to improvements in distortion.

In the absence of the protrusions of FIGS. 13A, 13B and 13C, positive values of the sampled-digital-input-signal $D'_{in}$ can result in only positive pulses in the delta-PWM-signal $\Delta PWM_{MRG}$, and therefore also only IDAC-current pulses with a magnitude $+I_{DACREF}$. Similarly, negative values of the sampled-digital-input-signal $D'_{in}$ can result in only IDAC-current pulses with a magnitude $-I_{DACREF}$. A mismatch between the positive and negative IDAC-current levels provided by the IDAC can lead to a sign dependent gain which in turn can cause even-order distortion.

However, in a balanced system, even-order distortion can be reduced or cancelled out. Class-D audio amplifiers can conveniently be realized as BTL amplifiers as discussed above, in order to double the output signal swing from the same supply rail. Consequently, even-order distortion can be adequately handled if the two bridge-halves are appropriately matched. Therefore, distortion can be reduced to an acceptable level if: the negative IDAC current levels of the two bridge-halves are sufficiently matched to each other; and the positive IDAC current levels of the two bridge-halves are sufficiently matched to each other. Matching a negative IDAC current level to its positive IDAC current level can be less important.

Figure 14A:
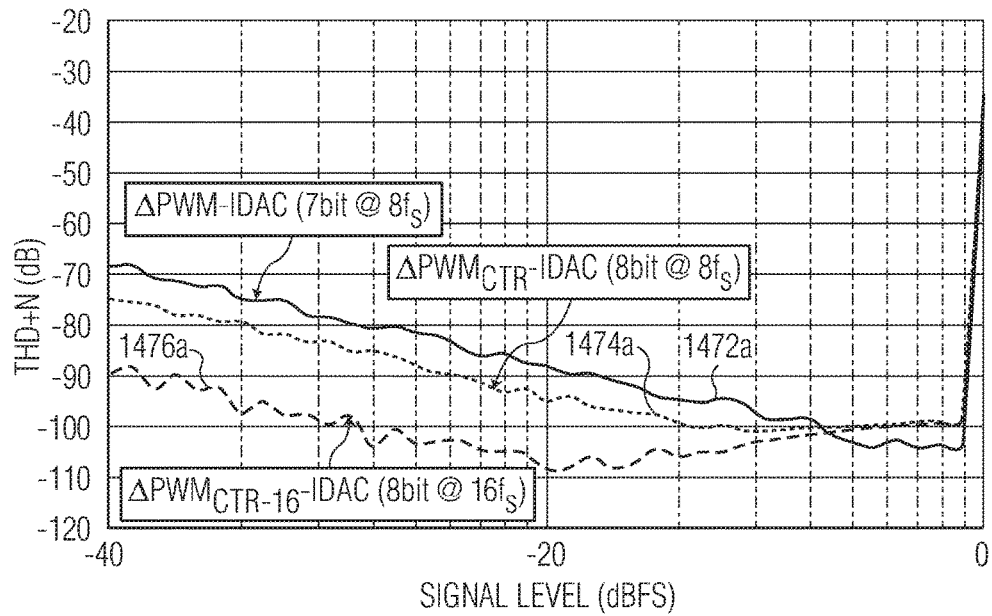
FIG. 14A illustrates the simulated total harmonic distortion plus noise (THD+N) of a three-level IDAC-current signal provided by the 1.5-bit IDAC of FIG. 6C.

FIG. 14A illustrates the simulated total harmonic distortion plus noise (THD+N) of a three-level IDAC-current signal provided by the 1.5-bit IDAC of FIG. 6C. The THD+N is shown versus the signal level of a 1 kHz digital-input-signal $D_{in}$. Only quantization noise is shown in the figure.

FIG. 14A shows the following three curves:

A ΔPWM-IDAC trace (solid curve) 1472a for the IDAC-current when the IDAC is driven with the delta-PWM-signal ΔPWM of FIGS. 7A, 7B and 7C. The ΔPWM-IDAC trace 1472a is simulated for the sigma-delta-modulator running at 8×fs, where fs is the frequency of the square-wave-carrier-signal $CLK_{PWM}$ (PWM carrier frequency), and for 7-bit output resolution of the sampled-digital-input-signal $D'_{in}$.

A $\Delta PWM_{CTR}$-IDAC trace (dotted curve) 1474a for the IDAC-current when the IDAC is driven with the delta-PWM-signal $\Delta PWM_{CTR}$ of FIG. 13C. The $\Delta PWM_{CTR}$-IDAC trace 1474a is simulated for the sigma-delta-modulator running at 8×fs and with 8-bit output resolution of the sampled-digital-input-signal $D'_{in}$. The delta-PWM-signal $\Delta PWM_{CTR}$ of FIG. 13C shows a 6 dB reduction in quantization noise relative to the ΔPWM-IDAC trace 1472a, resulting from the higher output resolution of the sampled-digital-input-signal $D'_{in}$.

A $\Delta PWM_{CTR-16}$-IDAC trace (dashed curve) 1476a for the IDAC-current when the IDAC is driven with the delta-PWM-signal $\Delta PWM_{CTR}$ of FIG. 13C, but this time for the sigma-delta-modulator running at 16×fs and with 8-bit output resolution of the sampled-digital-input-signal $D'_{in}$. The $\Delta PWM_{CTR-16}$-IDAC trace 1476a achieves an approximately 20 dB reduction in quantization noise level with respect to the ΔPWM-IDAC trace 1472a.

FIG. 14A also shows that at higher signal levels the distortion of the two $\Delta PWM_{CTR}$ traces 1474a, 1476a is slightly higher than the distortion of the ΔPWM-IDAC trace 1472a. However, this can change when the effect of an analogue-feedback-circuit is taken into account, as will be discussed below with reference to FIG. 14B.

Figure 14B:
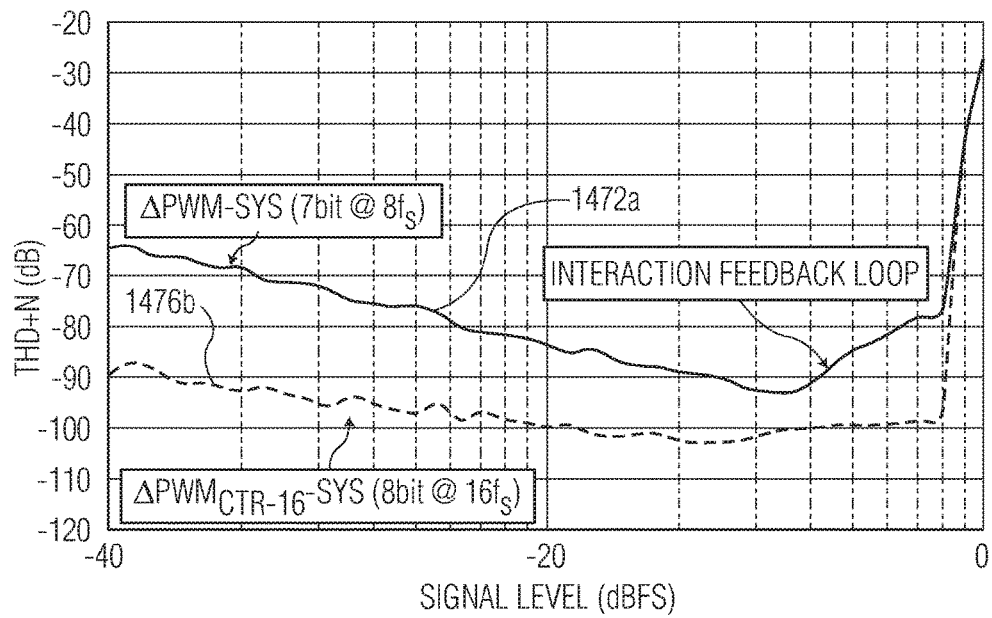
FIG. 14B shows the THD+N for an output-signal of a system or audio amplifier where the IDAC-current is driving a fixed-carrier analogue-feedback-circuit with a third-order-loop filter.

FIG. 14B shows the THD+N for an output-signal of a system or audio amplifier where the IDAC-current is driving a fixed-carrier analogue-feedback-circuit with a third-order-loop filter. The third-order-loop filter can comprise three loop-integrators.

FIG. 14B shows the following two curves:

A ΔPWM-SYS trace (solid curve) 1472b shows the THD+N of the output-signal of the system when the analogue-feedback-circuit is driven by the IDAC-current corresponding to the ΔPWM-IDAC trace 1472a. (That is, with the delta-PWM-signal ΔPWM of FIG. 7C.) The THD+N of the ΔPWM-SYS trace 1472b increases when the digital-input-signal $D_{in}$ higher than about 10 dB. This increase arises from the interaction of the delta-PWM-signal ΔPWM with the analogue-feedback-circuit as explained in relation to FIGS. 8A, 8B and 8C, when the delta-PWM-signal ΔPWM is generated as the explicit difference between the digital-PWM-signal DPWM and the square-wave-carrier-signal $CLK_{PWM}$, as illustrated in FIG. 7C.

A $\Delta PWM_{CTR-6}$-SYS trace (dashed curve) 1476b shows the THD+N of the output-signal of the system when the analogue-feedback-circuit is driven by the IDAC-current corresponding to the $\Delta$PWM-IDAC trace 1476a. (That is, with the delta-PWM-signal $\Delta PWM_{CTR}$ of FIG. 13C.) The $\Delta PWM_{CTR-6}$-SYS trace 1476b is similar to the $\Delta$PWM-IDAC trace 1476a. There is a negligible increase in THD+N in the output-signal of the system for digital-input-signal $D_{in}$ above 10 dB, relative to the THD+N of the IDAC-current. This shows that the constant transition rate, merged delta-PWM-signal $\Delta PWM_{CTR}$ may reduce or eliminate the interaction of the delta-PWM-signal $\Delta$PWM with the analogue-feedback-circuit. The non-CTR merged delta-PWM-signals $\Delta PWM_{MRG}$ illustrated in FIGS. 10A, 10B, 10C to 12 may exhibit a similar reduction in the output-signal THD+N above 10 dB relative to the non-merged delta-PWM-signals $\Delta$PWM of FIG. 7C.

One or more of the examples disclosed herein can use a 1.5-bit current DAC driven by a ($\Delta$)PWM-based digital signal. This digital signal format enables a zero-input noise mode, where the output current of the DAC is zero for most of the time. For example, it can be switched off completely (or nearly completely) instead of dithering around zero. Furthermore, the $\Delta$PWM modulation scheme can be tailored to the phase/timing of the PWM reference triangle used in an analogue feedback loop.

Advantageously, examples disclosed herein can be considered as decomposing a PWM signal into a carrier and a signal component, and injecting those signals at different locations in a feedback loop. Also, advantageously, $\Delta PWM_{CTR}$ schemes disclosed herein can apply a constant transition rate.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An amplifier circuit comprising:
    a delta-PWM-modulator configured to:
        receive a digital-input-signal;
        process the digital-input-signal and a modulator-triangular-signal to generate a delta-pulse-width-modulation-signal, wherein the delta-pulse-width-modulation-signal is representative of the difference between a square-wave-carrier-signal and a digital-pulse-width-modulationof the digital-input-signal;
    a three-level-DAC configured to receive the delta-pulse-width-modulation-signal from the delta-PWM-modulator and provide a three-level-analogue-signal;
    a loop-integrator comprising:
        a virtual-ground-node-terminal configured to receive: (i) the three-level-analogue-signal from the three-level DAC; and (ii) a feedback-signal from an output stage of the amplifier circuit via a feedback loop;
        an integrator-output-terminal configured to provide a loop-integrator-output-signal, which is proportional to an integral of the signals received at the virtual-ground-node-terminal; and
    a comparator comprising:
        a comparator-input-terminal configured to receive the loop-integrator-output-signal;
        a comparator-reference-terminal configured to receive a triangular-reference-signal that corresponds to the integral of the square-wave-carrier-signal; and
        a comparator-output-terminal configured to provide a drive-signal suitable for driving an output-stage of the amplifier circuit.

2. The amplifier circuit of claim 1, wherein the modulator-triangular-signal comprises a first-modulator-triangular-waveform and a second-modulator-triangular-waveform.

3. The amplifier circuit of claim 2, wherein:
    troughs of the first-modulator-triangular-waveform correspond in time to one of rising and falling edges of the square-wave-carrier-signal; and peaks of the second-modulator-triangular-waveform correspond in time to the other or rising and falling edges of the square-wave-carrier-signal.

4. The amplifier circuit of claim 2, wherein the second-modulator-triangular-waveform corresponds to a reflected, time-shifted, version of the first-modulator-triangular-waveform, wherein the reflection is about a zero-signal-level.

5. The amplifier circuit of claim 4, wherein the second-modulator-triangular-waveform is time shifted by half a period with reference to the first-modulator-triangular-waveform.

6. The amplifier circuit of claim 2, wherein the delta-PWM-modulator is configured to provide the delta-pulse-width-modulation-signal such that it has pulses located on an edge of the square-wave-carrier-signal.

7. The amplifier circuit of claim 2, wherein the first-modulator-triangular-waveform and the second-modulator-triangular-waveform each have range of values that overlaps with a range of potential values of the digital-input-signal, for the entire period of the square-wave-carrier-signal.

8. The amplifier circuit of claim 2, further comprising:
a sigma-delta-modulator configured to provide the digital-input-signal to the delta-PWM-modulator;
wherein the sigma-delta-modulator and the delta-PWM-modulator are configured to provide the digital-input-signal such that a new value of the digital-input-signal commences at a time corresponding to each top and/or bottom of each of the first-modulator-triangular-waveform and the second-modulator-triangular-waveform.

9. The amplifier circuit of claim 1, wherein the delta-PWM-modulator is configured to provide the delta-pulse-width-modulation-signal such that it has a constant transition rate.

10. The amplifier circuit of claim 1, wherein the delta-PWM-modulator is configured to provide the delta-pulse-width-modulation-signal such that it includes a pulse at each potential transition in the value of the digital-input-signal, irrespective of the value of the sampled-digital-input-signal.

11. The amplifier circuit of claim 2, wherein one or both of the first-modulator-triangular-waveform and the second-modulator-triangular-waveform have a range of values that are: greater than or equal to a negative-full-scale-value, and less than or equal to a positive-full-scale-value.

12. The amplifier circuit of claim 11, wherein:
the first-modulator-triangular-waveform includes negative protrusions extending from each trough of the first-modulator-triangular-waveform to a signal level that is less than or equal to the negative-full-scale-value; and
the second-modulator-triangular-waveform includes positive protrusions extending from each peak of the second-modulator-triangular-waveform to a signal level that is greater than or equal to the positive-full-scale-value.

13. The amplifier circuit of claim 2 wherein the first-modulator-triangular-waveform and the second-modulator-triangular-waveform each have a range of values that overlaps with a range of potential values of the digital-input-signal, for only a subset of the period of the square-wave-carrier-signal.

14. The amplifier circuit of claim 2, wherein the signal-level ranges of the first-modulator-triangular-waveform and the second-modulator-triangular-waveform do not overlap.

15. The amplifier circuit of claim 1, wherein the modulator-triangular signal has a range of values that are: greater than or equal to a negative-full-scale-value, and less than or equal to a positive-full-scale-value.

* * * * *